US009099548B2

(12) United States Patent
Zhang et al.

(10) Patent No.: US 9,099,548 B2
(45) Date of Patent: Aug. 4, 2015

(54) SEMICONDUCTOR DEVICE AND METHOD OF MANUFACTURING SAME

(71) Applicant: Renesas Electronics Corporation, Kanagawa (JP)

(72) Inventors: Ming Zhang, Kanagawa (JP); Yasuki Yoshihisa, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 56 days.

(21) Appl. No.: 13/965,559

(22) Filed: Aug. 13, 2013

(65) Prior Publication Data
US 2014/0070287 A1    Mar. 13, 2014

(30) Foreign Application Priority Data

Sep. 10, 2012   (JP) ................................. 2012-198183

(51) Int. Cl.
| | | |
|---|---|---|
| H01L 29/76 | (2006.01) | |
| H01L 29/94 | (2006.01) | |
| H01L 29/78 | (2006.01) | |
| H01L 21/265 | (2006.01) | |
| H01L 29/66 | (2006.01) | |
| H01L 21/762 | (2006.01) | |
| H01L 29/06 | (2006.01) | |
| H01L 29/08 | (2006.01) | |
| H01L 29/10 | (2006.01) | |
| H01L 21/761 | (2006.01) | |
| H01L 29/423 | (2006.01) | |

(52) U.S. Cl.
CPC .......... *H01L 29/78* (2013.01); *H01L 21/26586* (2013.01); *H01L 21/761* (2013.01); *H01L 21/76237* (2013.01); *H01L 29/0653* (2013.01); *H01L 29/0878* (2013.01); *H01L 29/1083* (2013.01); *H01L 29/66477* (2013.01); *H01L 29/66681* (2013.01); *H01L 29/7816* (2013.01); *H01L 29/7835* (2013.01); *H01L 29/0696* (2013.01); *H01L 29/42368* (2013.01)

(58) Field of Classification Search
CPC .......................... H01L 29/78; H01L 29/66477
USPC ........................................... 257/288; 438/294
See application file for complete search history.

(56) References Cited

U.S. PATENT DOCUMENTS

| | | | | |
|---|---|---|---|---|
| 6,051,868 | A | * | 4/2000 | Watanabe et al. ............. 257/503 |
| 8,357,989 | B2 | | 1/2013 | Onishi et al. |

(Continued)

FOREIGN PATENT DOCUMENTS

| | | |
|---|---|---|
| JP | H8-64686 | 3/1996 |
| JP | 2007-258501 | 10/2007 |
| JP | 2011-066067 | 3/2011 |

*Primary Examiner* — Theresa T Doan
(74) *Attorney, Agent, or Firm* — Young & Thompson

(57) ABSTRACT

To provide a semiconductor device and a manufacturing method thereof achieving both reduction in ON resistance and increase in breakdown voltage and suppressing a short circuit. The semiconductor device has, in its semiconductor substrate having a main surface, a p⁻ type epitaxial region, n⁻ type epitaxial region, n type offset region, and p type body region configuring a pn junction therewith; and further has a p⁺ type buried region between the p⁻ type and n⁻ type epitaxial regions, isolation trench extending from the main surface to the p⁺ type buried region, and trench sidewall n type region formed on at least a portion of the sidewall of the isolation trench. The n type impurity concentration in the trench sidewall n type region is higher than that in the n⁻ type epitaxial region. The trench sidewall n type region extends along the sidewall to reach the p⁺ type buried region.

6 Claims, 22 Drawing Sheets

(56) References Cited

U.S. PATENT DOCUMENTS

2003/0107103 A1* 6/2003 Iwata et al. .............. 257/506
2011/0062547 A1 3/2011 Onishi et al.
2013/0134549 A1 5/2013 Onishi et al.

* cited by examiner

SEMICONDUCTOR DEVICE AND METHOD OF MANUFACTURING SAME

CROSS-REFERENCE TO RELATED APPLICATIONS

The disclosure of Japanese Patent Application No. 2012-198183 filed on Sep. 10, 2012 including the specification, drawings and abstract is incorporated herein by reference in its entirety.

BACKGROUND

The present invention relates to a semiconductor device and a method of manufacturing the same, in particular, to a semiconductor device having a lateral element.

For semiconductor elements used as a switching driver, lateral high-breakdown-voltage MOS (metal oxide semiconductor) transistors have been used popularly. A lateral high-breakdown-voltage MOS transistor is disclosed, for example, in Japanese Patent Laid-Open No. 2011-66067 (Patent Document 1). In the lateral high-breakdown-voltage MOS transistor disclosed in Patent Document 1, a hollow formed in an element isolation trench contributes to an increase in breakdown voltage.

In addition, the semiconductor device disclosed in Japanese Patent Laid-Open No. 2007-258501 (Patent Document 2) and having a high-breakdown-voltage p type MOS transistor is formed on a so-called SOI (silicon on insulator) substrate and it has a dielectric isolation trench for element isolation around the p type MOS transistor.

Further, a lateral high-breakdown-voltage MOS transistor formed on an SOI substrate and having a dielectric isolation trench for element isolation is disclosed in Japanese Patent Laid-Open No. Hei 8 (1996)-64686 (Patent Document 3).

The semiconductor devices disclosed in the above-mentioned patent documents have, along the main surface of the semiconductor substrate thereof, a so-called buried layer in which an impurity region has been buried in the semiconductor substrate.

[Patent Document 1] Japanese Patent Laid-Open No. 2011-66067
[Patent Document 2] Japanese Patent Laid-Open No. 2007-258501
[Patent Document 3] Japanese Patent Laid-Open No. Hei 8 (1996)-64686

SUMMARY

In high-breakdown-voltage MOS transistors as described above, an epitaxial layer and the like having a relatively low impurity concentration are sometimes formed in order to suppress an increase in electric field intensity and thereby increase the breakdown voltage. Described specifically, for example, in the lateral high-breakdown-voltage MOS transistor of Patent Document 1, a diffusion region having a relatively low n type impurity concentration, which region is commonly called "n type offset region", is formed in a p type epitaxial layer. Then, a pn junction is formed between the p type epitaxial layer and the n type diffusion region and this pn junction forms a depletion layer. This depletion layer is likely to extend due to the low n type impurity concentration, which permits an increase in breakdown voltage. The above-mentioned impurity region having a low concentration formed for realizing a high-breakdown-voltage MOS transistor is called "RESURF" (reduced surface field) region".

When, for example, an element isolation trench is formed so as to penetrate through the RESURF region, however, there is a possibility of an impurity entering the RESURF region from the trench to reverse the conductivity type of the impurity in the RESURF region. If so, there is a possibility of a trouble, that is, a short circuit occurring between an impurity region of the high-breakdown-voltage MOS transistor such as source region or drain region and the above-mentioned buried layer.

The above-mentioned patent documents however include neither disclosure nor suggestion about the above-mentioned problem or means for resolving the problem.

Other problems and novel features will be apparent from the description herein and accompanying drawings.

A semiconductor device according to one mode of the invention has a semiconductor substrate, a first conductivity type first region, a second conductivity type second region, a second conductivity type third region, a first conductivity type fourth region, a first conductivity type buried region, an isolation trench, and a second conductivity type trench sidewall high concentration region. The first region is formed in the semiconductor substrate. The second region is formed in the semiconductor substrate and on the first region on the main surface side. The third region is formed in the semiconductor substrate and on the second region on the main surface side. The fourth region is formed in the semiconductor substrate so as to be adjacent to the third region and configure a pn junction therewith on the second region on the main surface side. The buried region is formed in the semiconductor substrate between the first region and the second region and has a first conductivity type impurity concentration higher than that of the first region. The isolation trench extends from the main surface to the buried region so as to surround the periphery of an element region including the third region. The trench sidewall high concentration region is formed on at least a portion of the sidewall of the isolation trench on the side of the element region. A second conductivity type impurity concentration in the trench sidewall high concentration region is higher than the second conductivity type impurity concentration in the second region and the trench sidewall high concentration region extends along the sidewall to reach the buried region.

In a method of manufacturing a semiconductor device according to another mode of the invention, first a semiconductor substrate having a main surface and a first conductivity type first region is provided. In the semiconductor substrate and on the first region on the main surface side, a first conductivity type buried region having a first conductivity type impurity concentration higher than that of the first region is formed. In the semiconductor substrate and on the first region and the buried region on the main surface side, a second conductivity type second region is formed. In the semiconductor substrate and on the second region on the main surface side, a second conductivity type third region is formed. An isolation trench is formed which extends so as to surround the periphery of an element region including the third region and reach from the main surface to the buried region. A second conductivity type trench sidewall high concentration region is formed on at least a portion of the sidewall of the isolation trench on the side of the element region. A first conductivity type fourth region is formed in the semiconductor substrate so as to be adjacent to the third region and configure a pn junction therewith on the second region on the main surface side. The second conductivity type impurity concentration in the trench sidewall high concentration region is higher than the second conductivity type impurity concentration in the second region and the trench sidewall high concentration region extends along the sidewall to reach the buried region.

According to the one mode, existence of the trench sidewall high concentration region suppresses a short circuit between the fourth region and the buried region.

According to the another mode, the trench sidewall high concentration region thus formed suppresses a short circuit between the fourth region and the buried region.

DETAILED DESCRIPTION

First Embodiment will hereinafter be described referring to drawings. (First Embodiment) First, the configuration of a semiconductor device according to First Embodiment will be described referring to FIG. 1.

Figure 1:
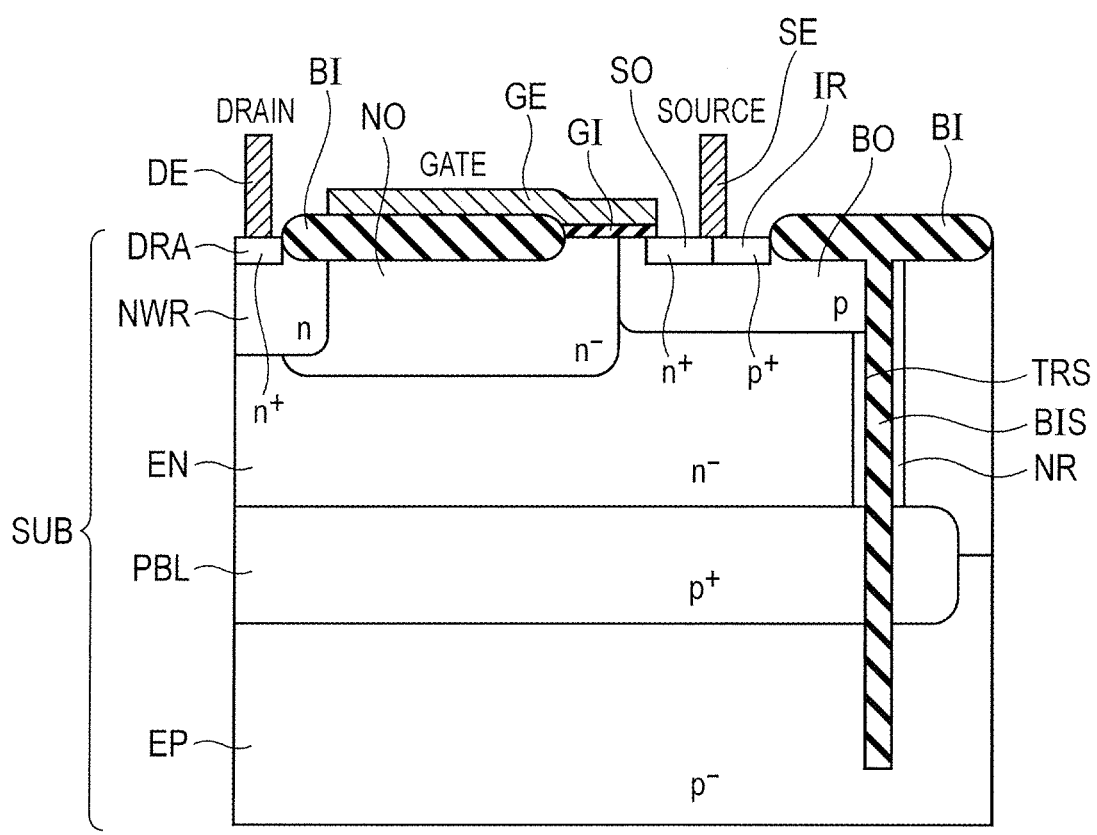
FIG. 1 is a cross-sectional view schematically showing the configuration of a semiconductor device according to First Embodiment.

As can be seen from FIG. 1, the semiconductor device according to First Embodiment has, for example, a LDMOS transistor (lateral insulating gate type field effect transistor). This semiconductor device is comprised mainly of a semiconductor substrate SUB, a $p^-$ type epitaxial region (first region) EP, a $p^+$ buried region (buried region) PBL, an $n^-$ type epitaxial region (second region) EN, an n type offset region (third region) NO, a p type body region (fourth region) BO, an n well region NWR, an isolation trench TRS, a trench sidewall n type region (trench sidewall high concentration region) NR, an $n^+$ drain region DRA, a drain electrode DE, an $n^+$ source region SO, a $p^+$ impurity region IR, a source electrode SE, a gate insulating film GI, a gate electrode layer GE, and a buried insulating film BI.

The semiconductor substrate SUB is made of, for example, silicon. This semiconductor substrate SUB has a main surface (the uppermost surface of the semiconductor substrate SUB in the drawing). The semiconductor substrate SUB has therein the $p^-$ type epitaxial region EP having a p type impurity as a first conductivity type impurity.

In the semiconductor substrate SUB and on the $p^-$ type epitaxial region EP on the main surface side (upper side in the drawing) of the semiconductor substrate SUB, the n⁻ type epitaxial region EN having an n type impurity as a second conductivity type impurity has been formed. In the semiconductor substrate SUB and on the n⁻ type epitaxial region E on the main surface side of the semiconductor substrate SUB, the n type offset region NO having an n type impurity has been formed.

The n well region NWR has been formed on the main surface of the semiconductor substrate SUB so as to be in contact with the n type offset region NO and it has an n type impurity concentration higher than that of the n type offset region NO. The n⁺ drain region DRA has been formed on the main surface of the semiconductor substrate SUB so as to be in contact with the n well region NWR and it has an n type impurity concentration higher than that of the n well region NWR. The drain electrode DE has been formed on the main surface of the semiconductor substrate SUB so as to be electrically coupled to the n⁺ drain region DRA.

In the semiconductor substrate SUB and on the n⁻ type epitaxial region EN on the main surface side (on the upper side of the drawing) of the semiconductor substrate SUB, the p type body region BO having a p type impurity has been formed. The p type body region BO has been formed on the n⁻ type epitaxial region EN on the main surface side of the semiconductor substrate SUB so as to be adjacent to the n type offset region NO and configures a pn junction therewith.

The n⁺ source region SO has been formed on the main surface of the semiconductor substrate SUB so as to configure a pn junction with the p type body region BO. In addition, on the main surface of the semiconductor substrate SUB, the p⁺ impurity region IR which is in contact with the n⁺ source region SO and has a higher p type impurity concentration than that of the p type body region BO has been formed. On the main surface of the semiconductor substrate SUB, the source electrode SE has been formed so as to be electrically coupled to both the n⁺ source region SO and the p⁺ impurity region IR. This p⁺ impurity region IR is an impurity region for fixing the potential of the p type body region BO to be almost equal to the potential of the source electrode SE.

These n⁺ source region SO and p⁺ impurity region IR are on the side opposite to the n well region NWR with respect to the buried insulating film BI formed on the main surface (almost right above the n type offset region NO) of the semiconductor substrate SUB so as to be buried in the semiconductor substrate SUB. The n⁺ source region SO is closer to the drain electrode DE than the p⁺ impurity region IR.

In the semiconductor substrate SUB and between the p⁻ type epitaxial region EP and the n⁻ type epitaxial region EN, the p⁺ type buried region PBL having a p type impurity has been formed. This p⁺ type buried region PBL has been formed as a layer running along the main surface of the semiconductor substrate SUB to configure a pn junction with the n⁻ type epitaxial region EN. This means that the p⁺ type buried region PBL planarly overlaps, in the semiconductor substrate SUB, with a major portion of the main surface of the semiconductor substrate SUB in a direction along the main surface of the semiconductor substrate SUB. It preferably spreads to a region planarly overlapping with the isolation trench TRS so as to be in contact with at least the isolation trench TRS.

The p⁺ type buried region PBL has a p type impurity concentration higher than that of the p⁻ type epitaxial region EP. As one example, it is a region having a p type impurity concentration of $5\times10^{17}$ atom cm$^{-3}$ or higher.

The buried insulating film BI has been placed to be in contact with the upper surface of a portion of the n type offset region NO and a portion of the n well region NWR. A buried insulating film BI other than the above-mentioned buried insulating film BI has been placed to cover the isolation trench TRS from above. The gate electrode layer GE has been formed on the p type body region BO and on the n type offset region NO sandwiched between the n⁺ drain region DRA and the n⁺ source region SO. A portion of this gate electrode layer GE has been stranded on the buried insulating film BI. The other portion of the gate electrode layer GE not been stranded on the buried insulating film BI has been formed on the p type body region BO and on the n type offset region NO via the gate insulating film GI.

So-called off-state breakdown voltage of the LDMOS of FIG. 1 depends on the field intensity at the pn junction between the n⁻ type epitaxial region EN and the p type body region BO. Local electric field concentration in the vicinity of the edge of the p type body region BO leads to a marked increase in the field intensity at the pn junction, which may reduce the off-state breakdown voltage of the LDMOS of FIG. 1. However, since the p⁺ type buried region PBL is provided and a pn junction is also formed between it and the n⁻ type epitaxial region EN, the field intensity at the pn junction between the n⁻ type epitaxial region EN and the p type body region BO decreases. This is because the field intensity at the pn junction when the pn junction exists only between the n⁻ type epitaxial region EN and p type body region BO is divided into the field intensity at the pn junction between the n⁻ type epitaxial region EN and the p type body region BO and the field intensity at the pn junction between the n⁻ type epitaxial region EN and the p⁺ type buried region PBL.

Even if the element pitch of the LDMOS of FIG. 1 is reduced, the off-state breakdown voltage of the LDMOS can be increased due to the existence of the p⁺ type buried region PBL, resulting in a decrease in so-called ON resistance of the LDMOS.

The isolation trench TRS surrounds, in a planar view, the periphery of the element region (region in which the LDMOS is to be formed) including the above-mentioned n type offset region NO to electrically isolate the LDMOS from another element placed outside the LDMOS. The isolation trench TRS has been formed to extend from the main surface of the semiconductor substrate SUB in a direction crossing the main surface (vertical direction in FIG. 1) and reach at least the p⁺ type buried region PBL. Like the isolation trench TRS of FIG. 1, however, it may penetrate through the p⁺ type buried region PBL from the main surface of the semiconductor substrate SUB and reach the p⁻ type epitaxial region EP.

The isolation trench TRS has therein a filling insulating layer BIS and the filling insulating layer BIS has been formed to fill the isolation trench TRS. The filling insulating layer BIS is made of, for example, a silicon oxide film and this filling insulating layer BIS in the isolation trench TRS contributes to electrical isolation of the LDMOS placed within the isolation trench TRS from another element placed outside the isolation trench.

The isolation trench TRS has, on at least a portion of the sidewall on the side where the LDMOS is to be placed (on the side of the element region), the trench sidewall n type region NR having an n type impurity. In FIG. 1, it has been formed in a region, of the sidewall of the isolation trench TRS on the side of the LDMOS, other than the formation region of the p type body region BO (on the lower side of the p type body region BO). As shown in FIG. 1, however, the trench sidewall n type region NR may cover the sidewall on the side other than the side where the LDMOS is to be formed, for example, the sidewall on the side opposite to the side where the LDMOS is to be formed (on the right side of the isolation trench TRS in FIG. 1).

The n type impurity concentration in the trench sidewall n type region NR is higher than the n type impurity concentration in the n⁻ type epitaxial region EN. Further, the trench sidewall n type region NR formed at least on the sidewall on the side where the LDMOS is to be formed extends along the sidewall of the isolation trench TRS so as to reach the p⁺ type buried region PBL.

Moreover, the n type impurity concentration in the trench sidewall n type region NR is lower than the p type impurity concentration in the p⁺ type buried region PBL. Here, in particular, the n type impurity concentration in the trench sidewall n type region NR is preferably lower than the p type impurity concentration at a position of the p⁺ type buried region PBL having the minimum impurity concentration.

Next, arrangement of the members of the semiconductor device of FIG. 1 in a planar view will next be described referring to FIGS. 2A and 2B.

Figure 2A:
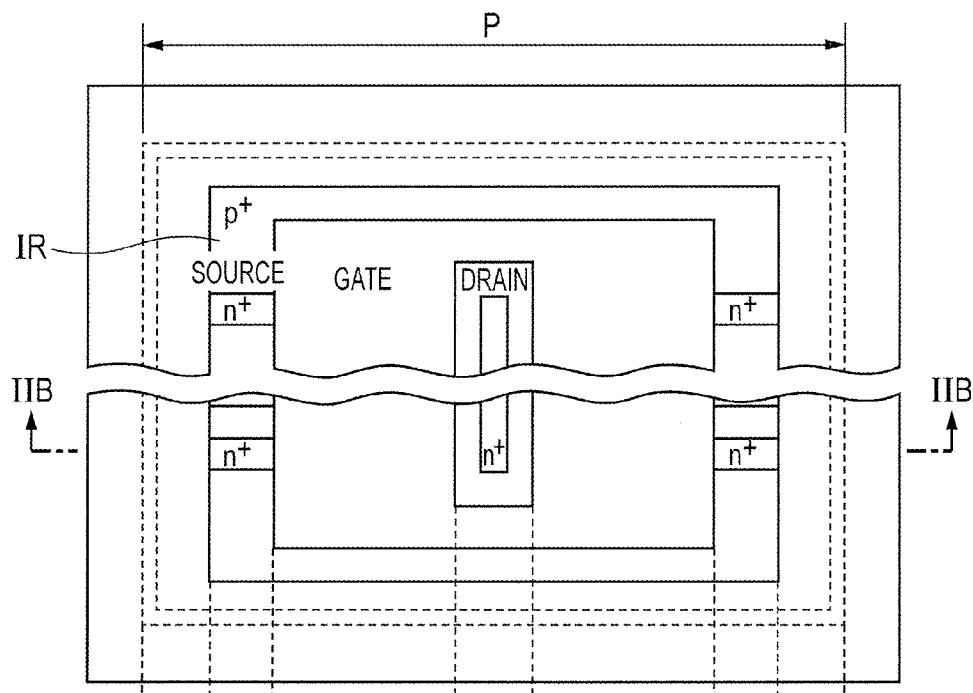
FIGS. 2A and 2B are a plan view and a cross-sectional view, respectively, of the semiconductor device shown in FIG. 1, the former one schematically showing the configuration of arranged unit portions in a planar view.
Figure 2B:
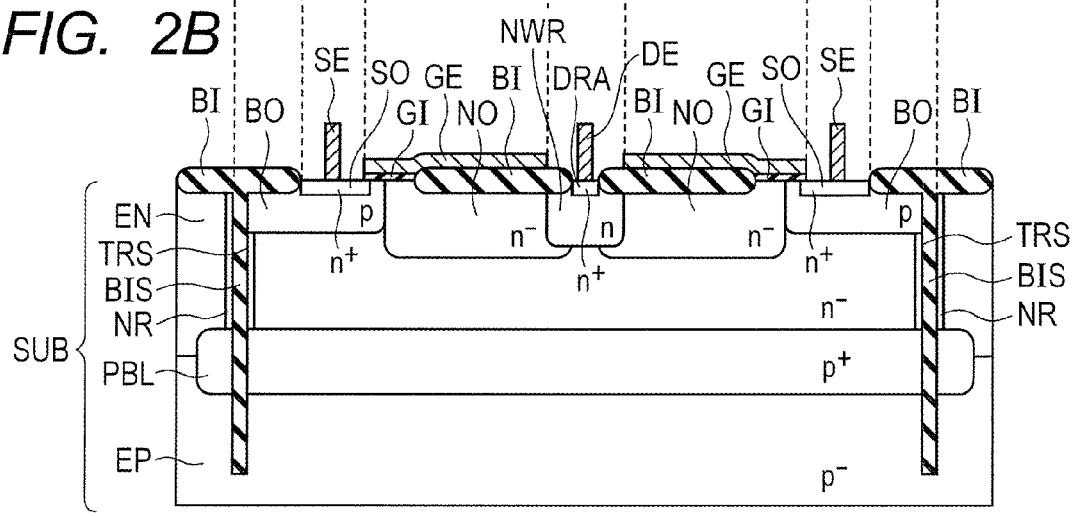

As is apparent from FIG. 1 and FIGS. 2A and 2B, FIG. 1 is only a right half of the LDMOS shown in FIG. 2B. In practice, the LDMOS has a bilaterally symmetrical configuration centered on an axis of symmetry extending vertically in FIG. 1 around the n⁺ drain region DRA. FIG. 2B shows the cross-sectional configuration of a portion taken along a line IIB-IIB of FIG. 2A. The configuration of the n⁺ source region SO in FIG. 2B is a little different from that in FIG. 1 from the standpoint of ensuring consistency with FIG. 2A.

As is apparent from the plan view of FIG. 2A, although gates, sources, or the like seem to be arranged as a bilaterally symmetrical pair in FIG. 2B, the gate, source or the like may surround the periphery of a single drain in practice. For example, with a range of the horizontally-extending pitch P shown in FIGS. 2A and 2B as a unit portion, this unit portion may be repeated in a horizontal direction.

Next, the impurity concentration distribution in each region of the semiconductor device of FIG. 1 will be described referring to FIGS. 3A and 3B.

Figure 3A:
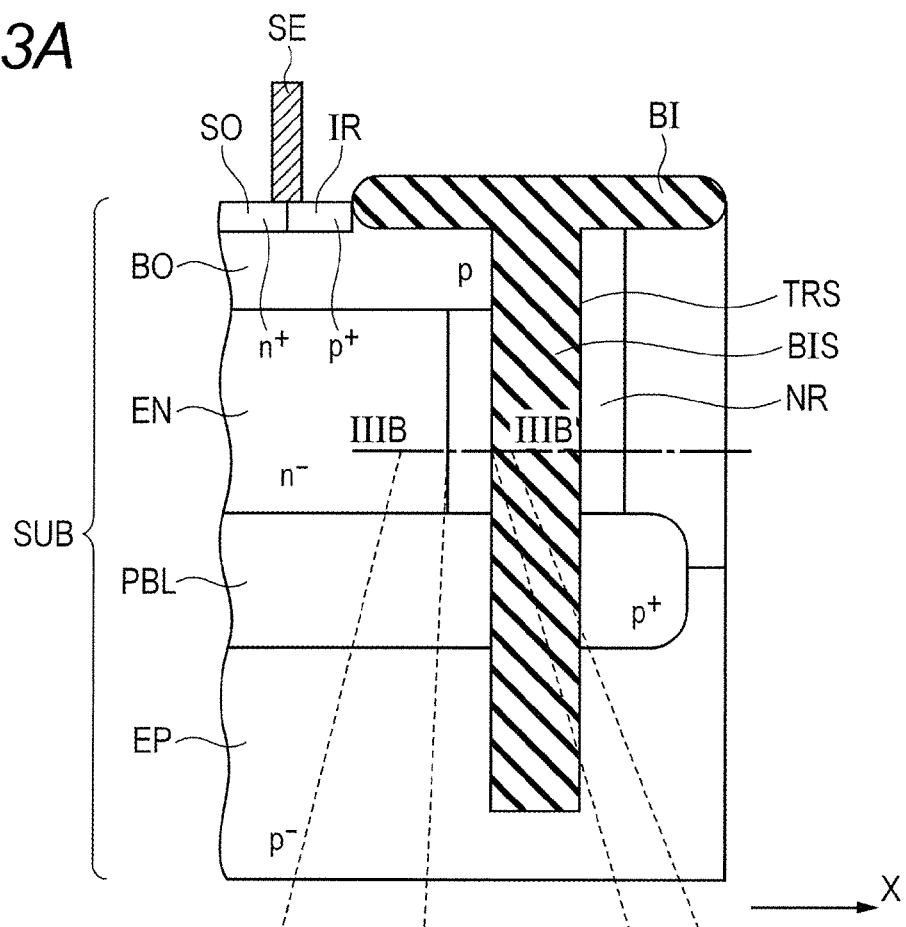
FIG. 3A is a cross-sectional view more specifically showing the configuration of an isolation trench of the semiconductor device of First Embodiment and the vicinity thereof and FIG. 3B shows an impurity concentration distribution of a portion along a dashed-dotted line IIIB-IIIB of FIG. 3A.
Figure 3B:
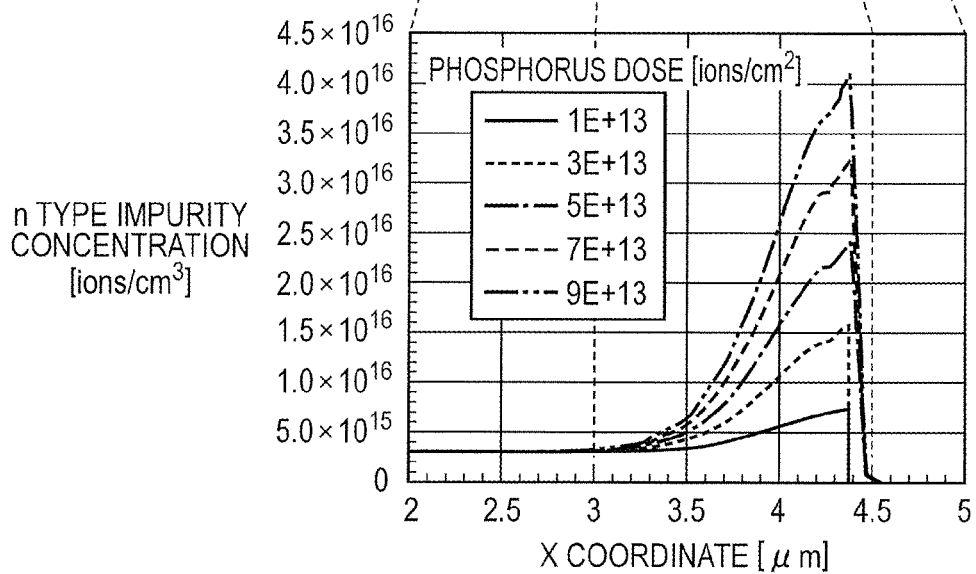

As is apparent from FIGS. 3A and 3B, FIG. 3B shows an impurity concentration distribution in a direction parallel to the main surface of the semiconductor substrate SUB which direction passes through a region along the line IIIB-IIIB of FIG. 3A, that is, through the formation regions of the n⁻ type epitaxial region EN and the trench sidewall n type region NR. Described specifically, the abscissa of FIG. 3B shows the coordinate (X coordinate) at each position on the line IIIB-IIIB of FIG. 3A. More specifically, the coordinate (X coordinate) at each position on the line IIIB-IIIB of FIG. 3A is shown by coupling each position on the line IIIB-IIIB of FIG. 3A to the X coordinate of FIG. 3B corresponding thereto. The ordinate of FIG. 3B shows an n type impurity concentration at each position on the line IIIB-IIIB of FIG. 3A. FIG. 3B shows an n type impurity concentration at each position on the line IIIB-IIIB when the dose (amount of an impurity introduced by ion implantation) of the n type impurity (phosphorus) for the formation of the trench sidewall n type region NR is changed in five ways, that is, $1\times10^{13}$ atom/cm², $3\times10^{13}$ atom/cm², $5\times10^{13}$ atom/cm², $7\times10^{13}$ atom/cm² and $9\times10^{13}$ atom/cm².

A region having an X coordinate not greater than about 3 μm in FIG. 3B corresponds to the n⁻ type epitaxial region EN outside the trench sidewall n type region NR. A region having an X coordinate greater than about 3 μm (particularly, about 3.5 μm or greater) but not greater than 4.5 μm has a higher impurity concentration with an increase in the value of the X coordinate and this region corresponds to the trench sidewall n type region NR. When the X coordinate exceeds about 4.5 μm, the impurity concentration drastically decreases to almost 0. This region corresponds to the inside of the isolation trench TRS. This suggests that the isolation trench TRS has a thickness of from about 1 to 1.5 μm in a direction (horizontal direction in the drawing) crossing the sidewall.

The n type impurity concentration in the n⁻ type epitaxial region EN is, as shown in the region having an X coordinate of about 3 μm or less in FIG. 3B, about $3\times10^{15}$ atom cm⁻³ and the n type impurity concentration in the n⁻ type epitaxial region EN is almost constant.

The n type impurity concentration in the trench sidewall n type region NR is higher than the n type impurity concentration in the n⁻ type epitaxial region EN. The term "trench sidewall n type region NR" as used herein means an arbitrary region, on the sidewall of the isolation trench TRS, having an n type impurity concentration higher than that of the n⁻ type epitaxial region EN which is kept almost constant, more specifically, a region from the X coordinate of about 4.5 μm to the X coordinate of about 3 μm and having a concentration down to the concentration of the n⁻ type epitaxial region EN.

As will be described later, it is to be noted that the concentration of the trench sidewall n type region NR at any position in the vertical direction of this drawing is almost the same. FIGS. 3A and 3B show one example of the concentration distribution of the trench sidewall n type region NR at a position a little lower than the center in the vertical direction in the drawing, but the impurity concentration distribution at a position on a horizontally-extending straight line passing through another region within the trench sidewall n type region NR, for example, at a position above the center in the vertical direction in the drawing is almost the same as that of FIG. 3B. The n type impurity concentration in the trench sidewall n type region NR is almost the same at any position if the positions have the same X coordinate, though different in the depth direction.

A method of manufacturing the semiconductor device of First Embodiment will next be described referring to FIGS. 4 to 19.

Figure 4:
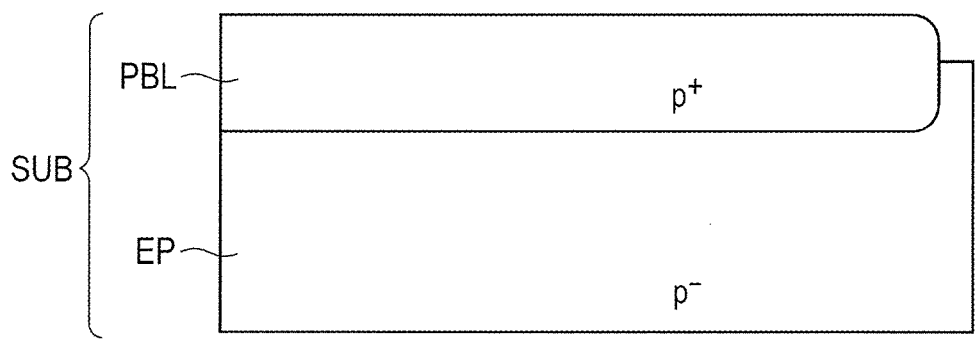
FIG. 4 is a schematic cross-sectional view showing a first step of a method of manufacturing the semiconductor device of First Embodiment.

As shown in FIG. 4, a p⁻ type epitaxial region EP is formed in a semiconductor substrate by epitaxial growth to provide a semiconductor substrate SUB having the p⁻ type epitaxial region EP.

Next, p type ions are implanted into the surface of the p⁻ type epitaxial region EP by ion implantation. Then, annealing is conducted to diffuse the p type ions implanted into the surface of the p⁻ type epitaxial region EP, whereby a p⁺ type buried region PBL is formed on the surface of the p⁻ type epitaxial region EP. This means that the p⁺ type buried region PBL is formed on the p⁻ type epitaxial region EP in the semiconductor substrate SUB and on the main surface side (upper side in the drawing) of the semiconductor substrate SUB. This p⁺ type buried region PBL is formed so as to have a p type impurity concentration higher than the p type impurity concentration of the p type epitaxial region EP. More specifically, it is formed, as one example, as a region having a p type impurity concentration of $5\times10^{17}$ atom cm⁻³ or higher.

Although it is preferred to form the p⁺ type buried region PBL on most of the surface of the p⁻ type epitaxial region EP, the p⁺ type buried region PBL is not necessarily formed on the whole surface of the p⁻ type epitaxial region EP. It is however preferred to form this region so as to include a region right below a formation region of an isolation trench TRS which will be described later.

Figure 5:
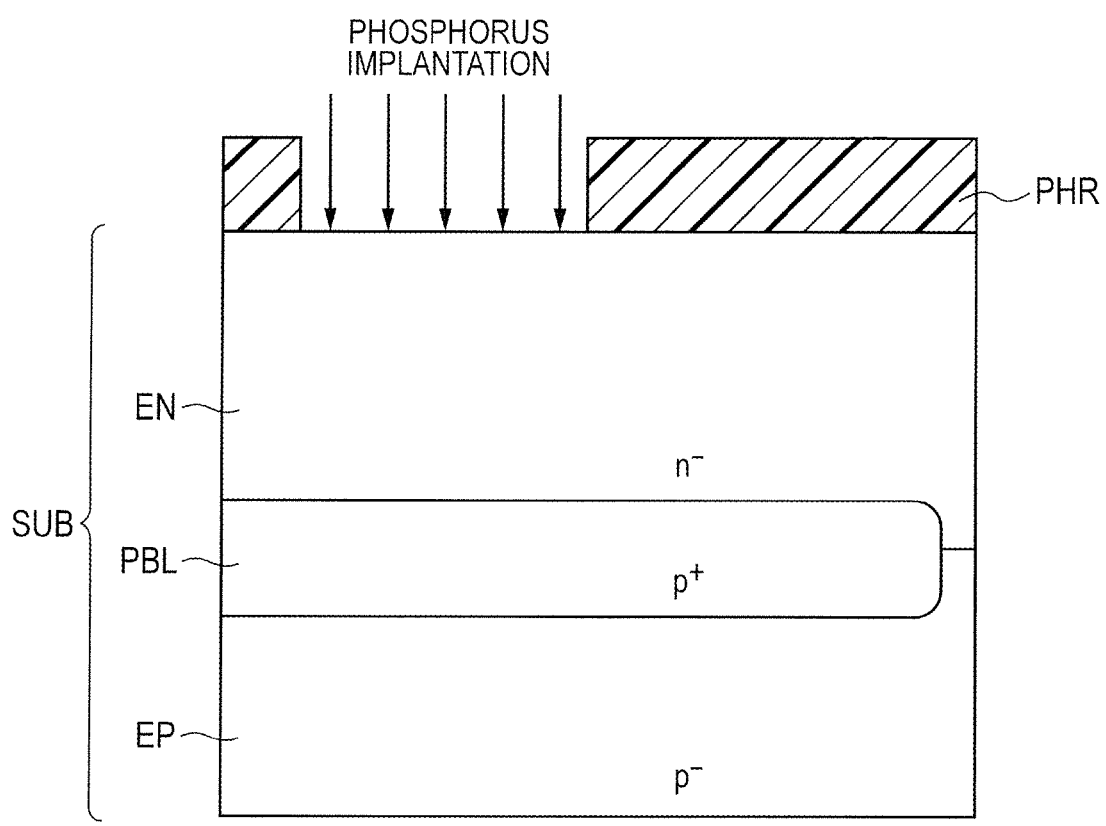
FIG. 5 is a schematic cross-sectional view showing a second step of the method of manufacturing the semiconductor device of First Embodiment.

As shown in FIG. 5, an n⁻ type epitaxial region EN is formed on the p⁻ type epitaxial region EP and the p⁺ type buried region PBL. This means that the n⁻ type epitaxial region EN is formed on the p⁻ type epitaxial region EP and the p⁺ type buried region PBL in the semiconductor substrate SUB on the main surface side of the semiconductor substrate SUB. Here, the n⁻ type epitaxial region EN is formed to have, for example, an n type impurity concentration of about $5\times10^{15}$ atom cm⁻³ ($1\times10^{15}$ atom cm⁻³ or higher but not higher than $5\times10^{15}$ atom cm⁻³).

Next, by the usual photolithography, a photoresist pattern PHR is formed on the surface of the n⁻ type epitaxial region EN. With this photoresist pattern PHR as a mask, n type ions are implanted into the surface of the n⁻ type epitaxial region EN by ion implantation. At this time, through this photoresist pattern PHR, n type ions are selectively implanted into the surface of the n⁻ type epitaxial region EN. The photoresist pattern PHR is then removed, for example, by ashing.

Figure 6:
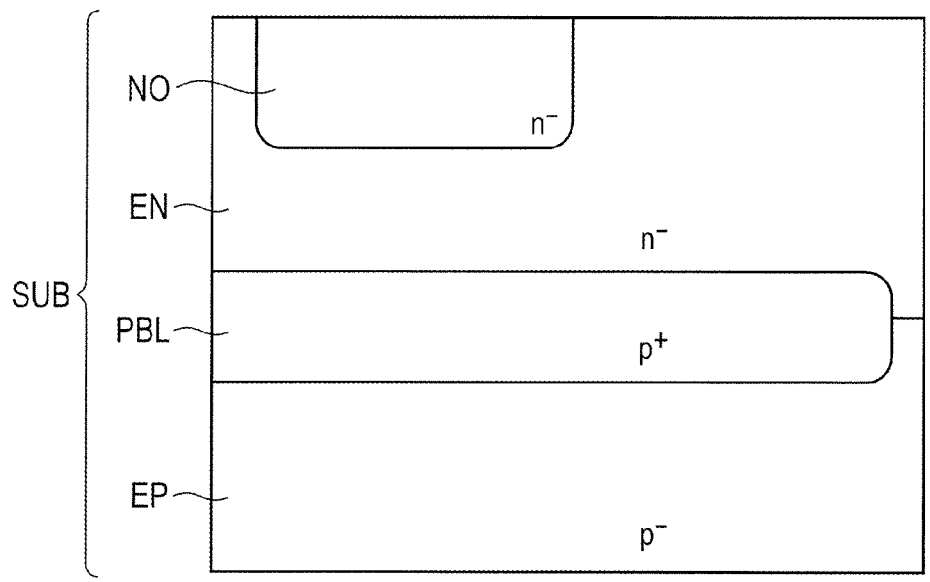
FIG. 6 is a schematic cross-sectional view showing a third step of the method of manufacturing the semiconductor device of First Embodiment.

As is shown in FIG. 6, by the above-mentioned implantation treatment of n type ions, an n type offset region NO is formed in the n⁻ type epitaxial region EN in the semiconductor substrate SUB and on the main surface side of the semiconductor substrate SUB.

Figure 7:
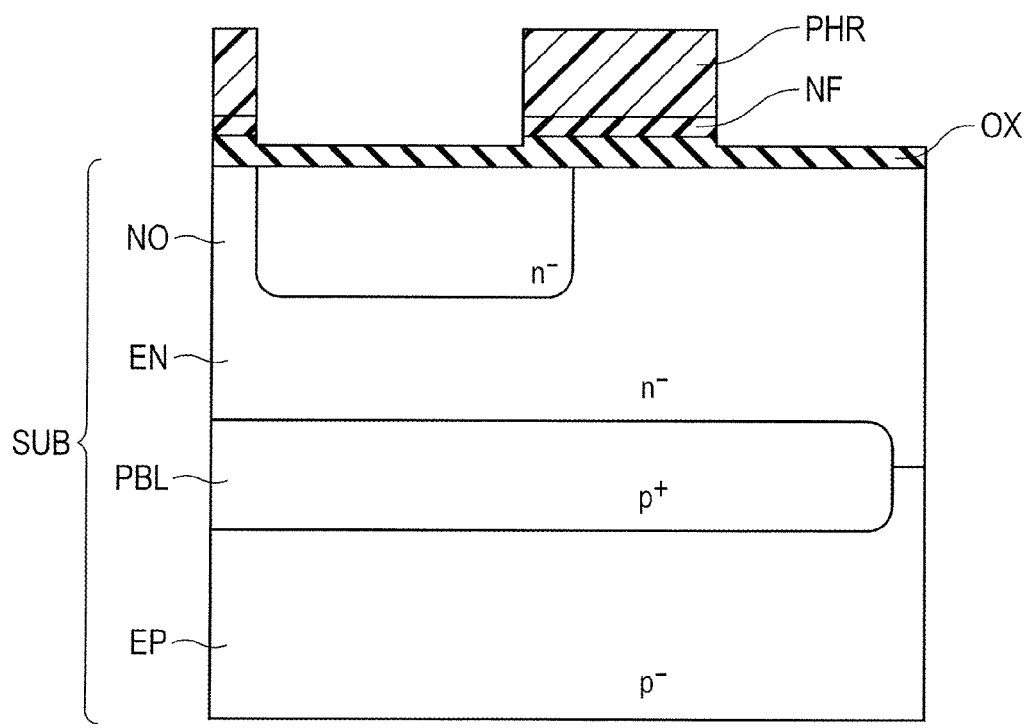
FIG. 7 is a schematic cross-sectional view showing a fourth step of the method of manufacturing the semiconductor device of First Embodiment.

As shown in FIG. 7, after a silicon oxide film OX and a silicon nitride film NF are stacked in order of mention on the surface of the semiconductor substrate SUB (n⁻ type epitaxial region EN), the usual photolithography and etching are conducted to remove a portion of the silicon nitride film NF. In a region where the silicon nitride film NF has been removed, the silicon oxide film OX right therebelow may also be etched a little and become thinner than that in the other region.

Figure 8:
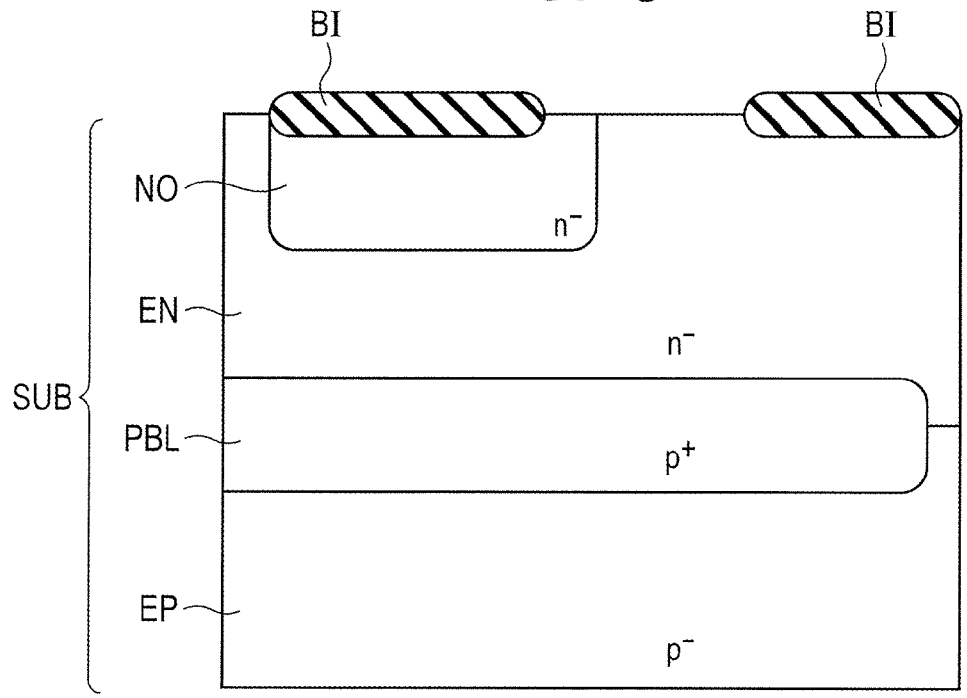
FIG. 8 is a schematic cross-sectional view showing a fifth step of the method of manufacturing the semiconductor device of First Embodiment.

As is shown in FIG. 8, the silicon oxide film OX exposed in FIG. 7 is oxidized to become thick and thus, a buried insulating film BI is formed. Here, oxidation is preferably promoted by using, for example, wet oxidation. After the oxidation process, the photoresist pattern PHR in FIG. 7 is removed and the silicon oxide film OX which has remained unoxidized and the silicon nitride film NF are removed.

Figure 9:
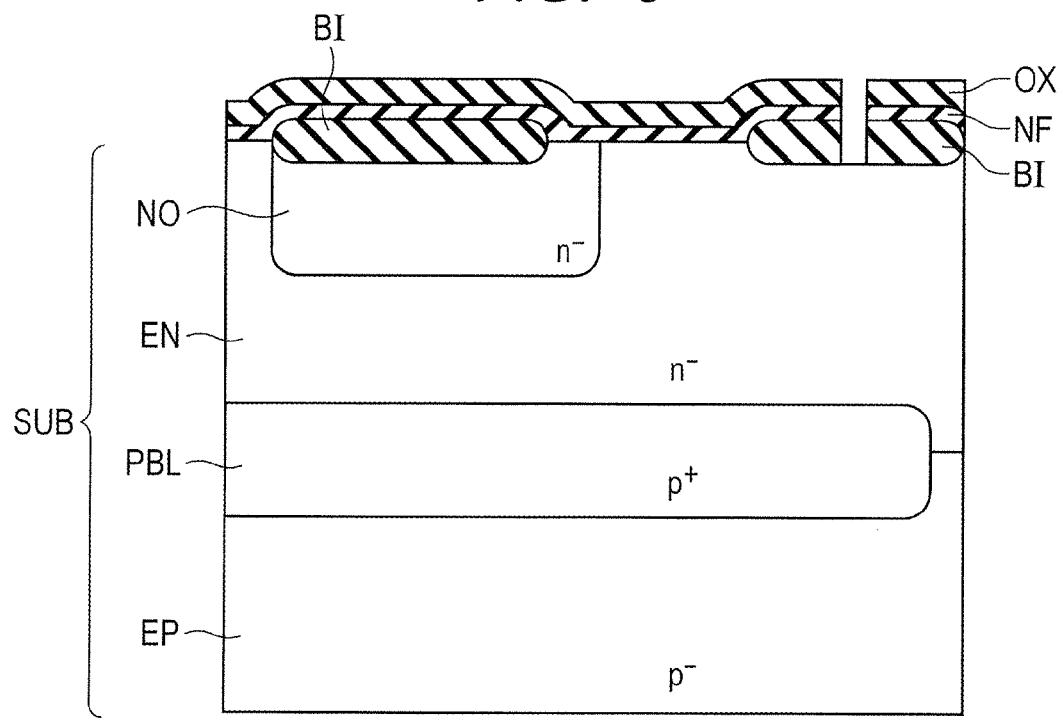
FIG. 9 is a schematic cross-sectional view showing a sixth step of the method of manufacturing the semiconductor device of First Embodiment.

As is shown in FIG. 9, a silicon nitride film NF and a silicon oxide film OX are stacked in order of mention so as to cover the surface of the semiconductor substrate SUB (the surfaces of the n⁻ type epitaxial region EN and the buried insulating film BI) in order to form an isolation trench TRS.

Next, by using the usual photolithography and etching, the silicon nitride film NF, the silicon oxide film OX, and the buried insulating film BI placed right therebelow are removed to form a trench in a region overlapping with a portion of the buried oxide film BI. Thus, a mask pattern composed of the silicon nitride film NF, silicon oxide film OX, and buried insulating film BI is formed.

Figure 10:
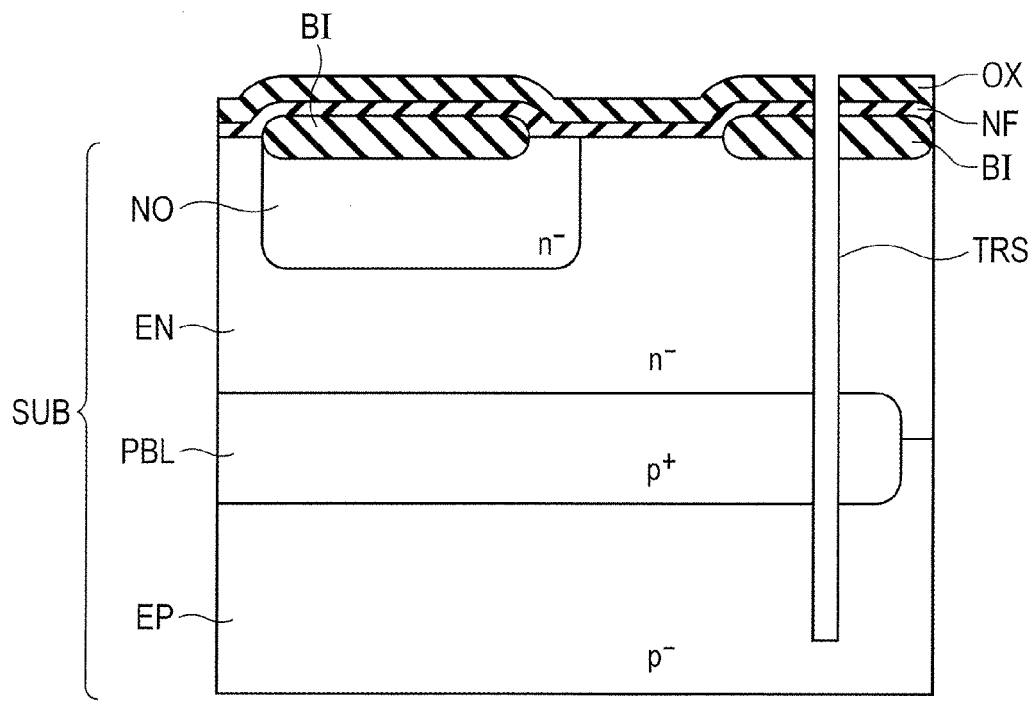
FIG. 10 is a schematic cross-sectional view showing a seventh step of the method of manufacturing the semiconductor device of First Embodiment.

As shown in FIG. 10, by using the mask pattern comprised of the silicon nitride film NF, silicon oxide film OX, and buried insulating film BI, the n⁻ type epitaxial region EN and the like in the semiconductor substrate SUB are etched to form an isolation trench TRS having a mode that surrounds the periphery of a region which includes the n type offset region NO and will finally be an element region, and extending along the sidewall of the region from the main surface of the semiconductor substrate SUB to the p⁺ type buried region PBL.

Figure 11:
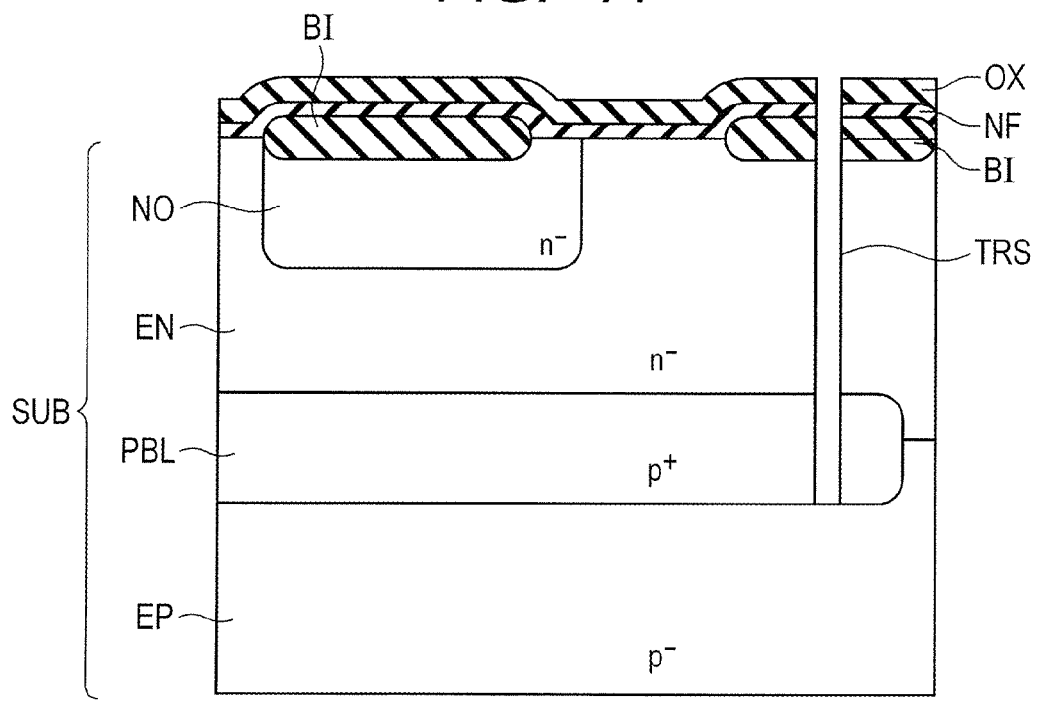
FIG. 11 is a schematic cross-sectional view showing a modification example of the seventh step of the method of manufacturing the semiconductor device of First Embodiment different from that shown in FIG. 10.

The isolation trench TRS may, as shown in FIG. 10, extend from the main surface of the semiconductor substrate SUB, penetrate the p⁺ type buried region PBL, and reach the inside of the p⁻ type epitaxial region EP, but as shown in FIG. 11, the isolation trench TRS may reach at least the p⁺ type buried region PBL.

Figure 12:
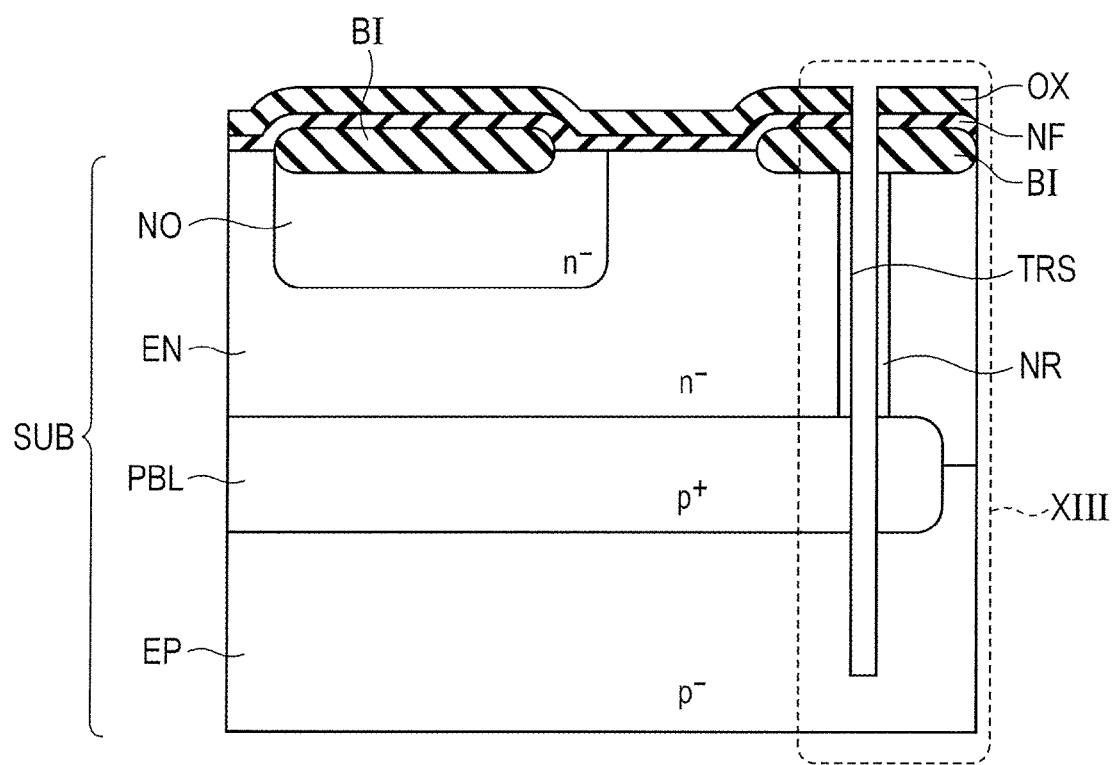
FIG. 12 is a schematic cross-sectional view showing an eighth step of the method of manufacturing the semiconductor device of First Embodiment.
Figure 13:
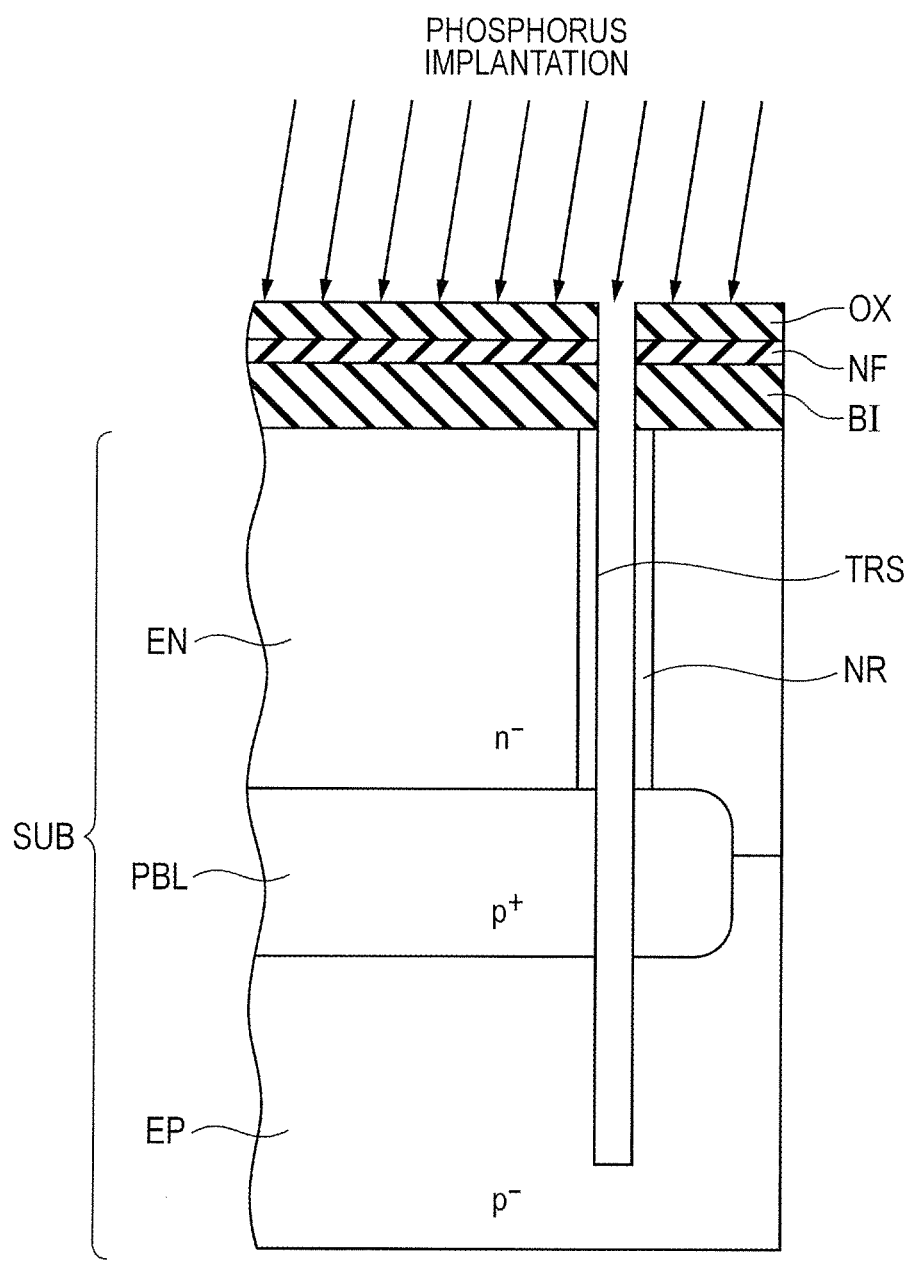
FIG. 13 is a schematic cross-sectional view showing a mode of ion implantation for forming a trench sidewall n type region NR in the region XIII surrounded by the dotted line of FIG. 12.

As shown in FIG. 12 and FIG. 13, a trench sidewall n type region NR is formed on the sidewall of the isolation trench TRS by using ion implantation. Here, the isolation trench TRS is formed so as to reach the p⁻ type epitaxial region EP and the trench sidewall n type region NR is formed so as to reach the p⁺ type buried region PBL. In practice, the trench sidewall n type region NR may be formed on at least a portion of the sidewall of the isolation trench TRS, in particular, on at least a portion of the sidewall on the side of the element region (on the left side in FIG. 12: on the side where the LDMOS is to be formed) so as to reach the p⁺ type buried region PBL.

In particular, as shown in FIG. 13, in a step of forming the trench sidewall n type region NR, n type ions are implanted into the main surface of the semiconductor substrate SUB in an oblique direction with respect to the main surface. More specifically, n type ions (phosphorus ions) are implanted into the main surface of the semiconductor substrate SUB preferably from a direction of about 7° with respect to the main surface. In other words, in the step of forming the trench sidewall n type region NR, n type ions (second conductivity type impurities) are implanted preferably from an oblique direction with respect to the sidewall of the isolation trench TRS.

The n type impurity concentration in the trench sidewall n type region NR is higher than the n type impurity concentration in the n⁻ type epitaxial region EN and lower than the p type impurity concentration in the p⁺ type buried region PBL (at a position having the minimum impurity concentration). As described above, although the range of the trench sidewall n type region NR is defined as a region having a higher concentration than the n⁻ type epitaxial region EN which is a region having a saturated impurity concentration, it is preferred to think that the n type impurity concentration in the trench sidewall n type region NR is an n type impurity concentration in a region having the highest n type impurity concentration which appears at the X coordinate of about 4.5 μm in FIG. 3B.

For example, when the n type impurity concentration of the n type epitaxial region EN is about $5\times10^{15}$ atom cm⁻³ and the p type impurity concentration of the p⁺ type buried region PBL is about $5\times10^{17}$ atom cm⁻³, the n type impurity concentration of the trench sidewall n type region NR is preferably $1\times10^{16}$ atom cm⁻³ or higher but not higher than $1\times10^{17}$ atom cm⁻³. It is therefore preferred to regulate the dose of phosphorus to $3\times10^{13}$ atom/cm² or greater but not greater than $9\times10^{13}$ atom/cm². As will be described later, however, the actual dose of phosphorus is adjusted to $3\times10^{13}$ atom/cm² or greater but not greater than $7\times10^{13}$ atom/cm².

When ion implantation to the sidewall of the isolation trench having a width, in the main surface direction, of about 1 μm is conducted from an oblique direction (from a direction of about 7° with respect to the main surface) as shown in FIG. 13, n type ions are implanted, in a region about 10 μm deep in the vertical direction in the drawing from the main surface of the semiconductor substrate SUB, to give an almost uniform concentration distribution irrespective of the depth of the region. The thickness of the n⁻ type epitaxial region EN in the vertical direction of FIG. 3A is about 5 μm. The trench sidewall n type region NR therefore shows an almost constant impurity concentration distribution irrespective of the position in the vertical direction of this drawing. Although the graph of FIG. 3B shows, as one example, the concentration distribution of the trench sidewall n type region NR at a position a little lower than the center in the vertical direction of the drawing as shown in FIG. 3A, the impurity concentration distribution at a position on a horizontally-extending straight line passing through another region within the trench sidewall n type region NR, for example, at a position above the center in the vertical direction in the drawing is almost the same as that of FIG. 3B at the same X coordinate.

Moreover, in the treatment shown in FIG. 13, implantation of, for example, phosphorus is always conducted in the same direction (to the left side in FIG. 13) to the sidewall of the isolation trench TRS. In this case, ion implantation is conducted to form the trench sidewall n type region NR on at least the sidewall on the side where the LDMOS is to be formed on the left side of FIG. 13.

When ion implantation to the whole surface of the sidewall of the isolation trench TRS (for example, including the right side of FIG. 13) is aimed at, it is preferred to conduct ion implantation while turning the semiconductor substrate SUB with the central axis extending in a direction where the solution trench TRS extends (vertical direction in the drawing) as a center. In such a manner, ions can be implanted into the whole surface of the sidewall of the isolation trench TRS.

Figure 14:
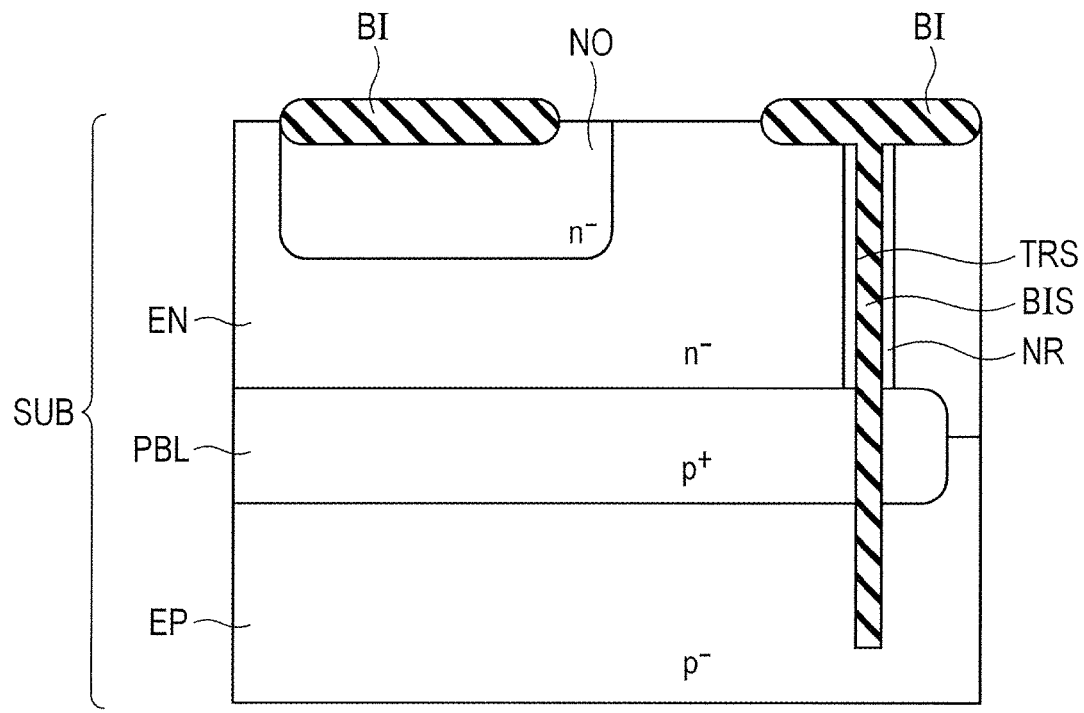
FIG. 14 is a schematic cross-sectional view showing a ninth step of the method of manufacturing the semiconductor device of First Embodiment.

As shown in FIG. 14, after removal of the silicon nitride film NF and silicon oxide film OX formed in the step of FIG. 9, a silicon oxide film is formed so as to cover the main surface of the semiconductor substrate SUB. The isolation trench TRS is therefore filled with a filling insulating layer BIS made of this silicon oxide film. By this treatment, a trench of the buried insulating film BI formed right above the isolation trench TRS is also filled with the silicon oxide film.

Figure 15:
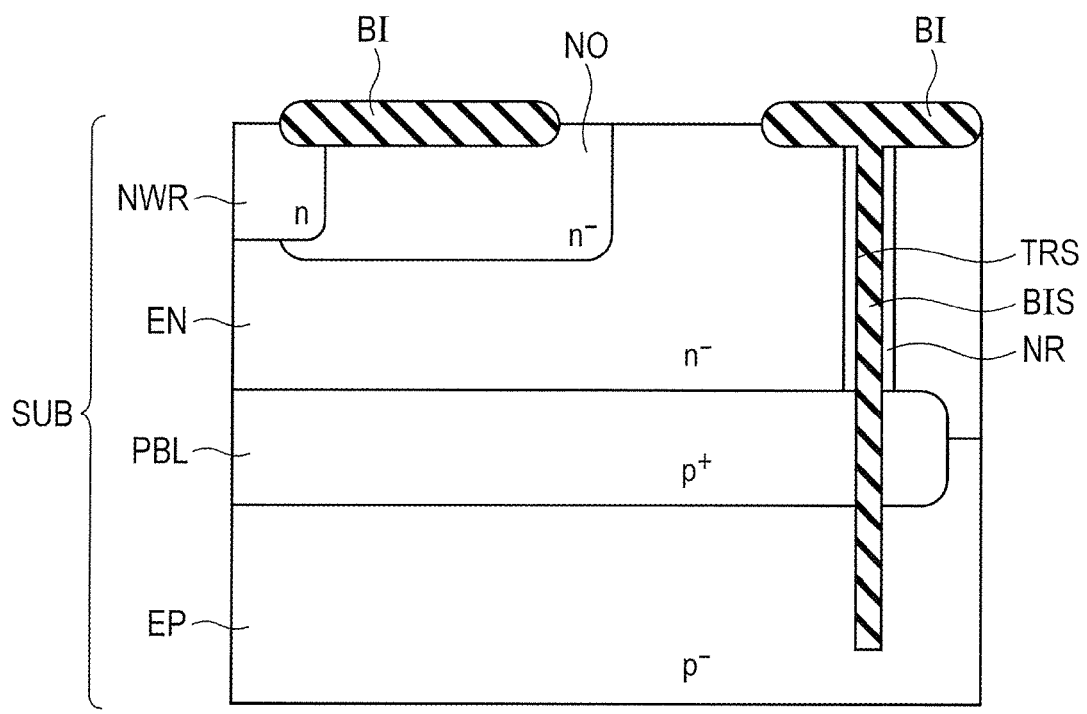
FIG. 15 is a schematic cross-sectional view showing a tenth step of the method of manufacturing the semiconductor device of First Embodiment.

As shown in FIG. 15, for example, by the treatment similar to that employed in the step of FIG. 5 using the usual photolithography and ion implantation, an n well region NWR is formed at a desired position in the semiconductor substrate SUB and on the main surface side of the semiconductor substrate SUB.

Figure 16:
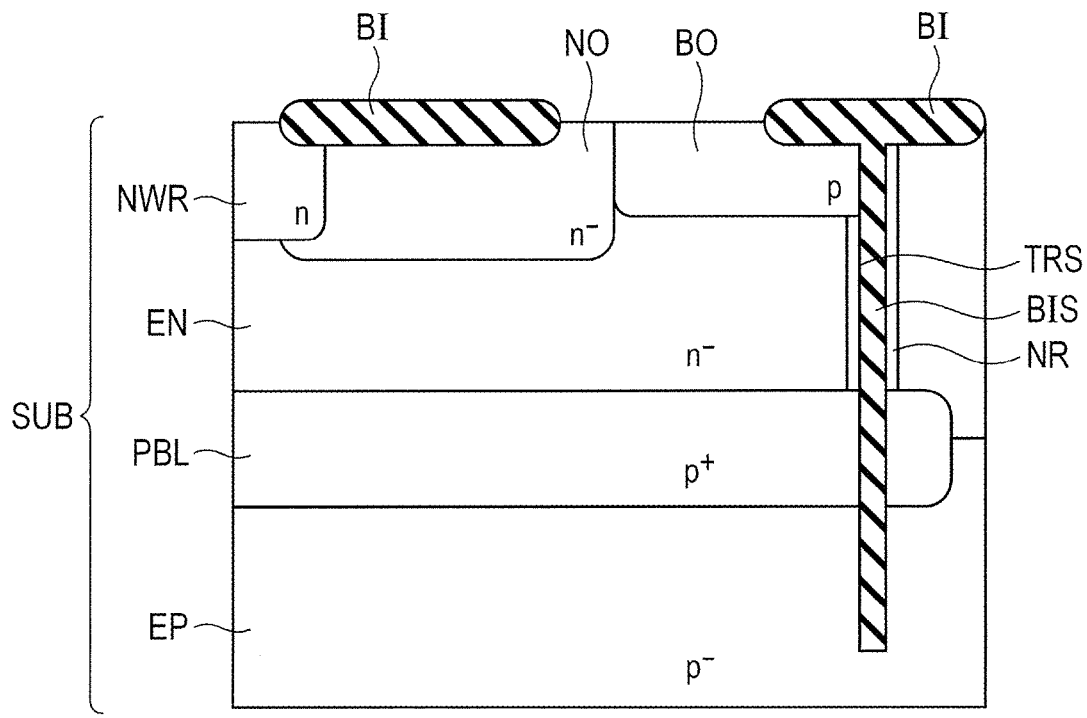
FIG. 16 is a schematic cross-sectional view showing an eleventh step of the method of manufacturing the semiconductor device of First Embodiment.

As shown in FIG. 16, for example, by the treatment similar to that employed in the step of FIG. 5 using the usual photolithography and ion implantation, a p type body region BO is formed at a desired position in the semiconductor substrate SUB and on the main surface side of the semiconductor substrate SUB. The p type body region BO is adjacent to the n type offset region NO and configures a pn junction therewith.

The p type impurity concentration of the p type body region BO is usually higher than the n type impurity concentration of the trench sidewall n type region NR. Due to the formation of the p type body region BO, particularly a portion of the trench sidewall n type region NR close to the main surface of the semiconductor substrate SUB is sometimes replaced by the p type body region BO. This means that the trench sidewall n type region NR is not necessarily formed on the whole surface of the sidewall of the isolation trench TRS as described above and it may be formed on at least a portion of the sidewall (so as to reach at least the $p^+$ type buried region PBL).

Figure 17:
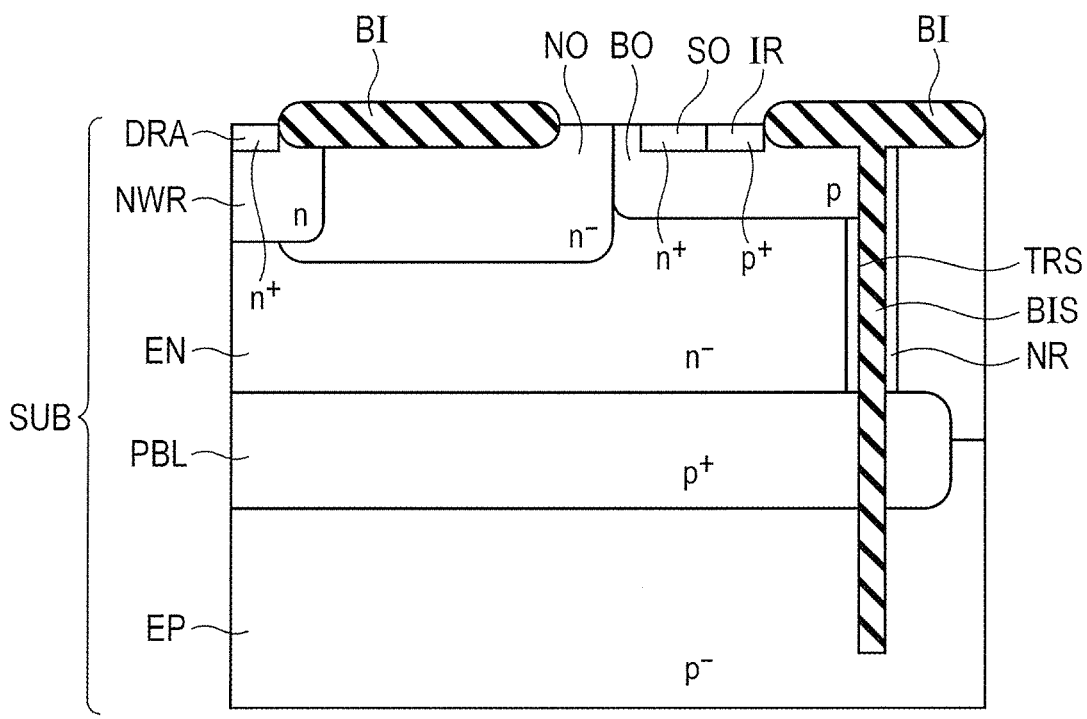
FIG. 17 is a schematic cross-sectional view showing a twelfth step of the method of manufacturing the semiconductor device of First Embodiment.

As is shown in FIG. 17, by the similar treatment using the usual photolithography and ion implantation, an $n^+$ type drain region DRA, an $n^+$ type source region SO, and a $p^+$ type impurity region IR are formed. The $n^+$ type drain region DRA has an n type impurity concentration higher than the n well region NWR, while the $n^+$ type source region SO and the $p^+$ type impurity region IR have an n type (p type) impurity concentration higher than that of the p type body region BO.

Figure 18:
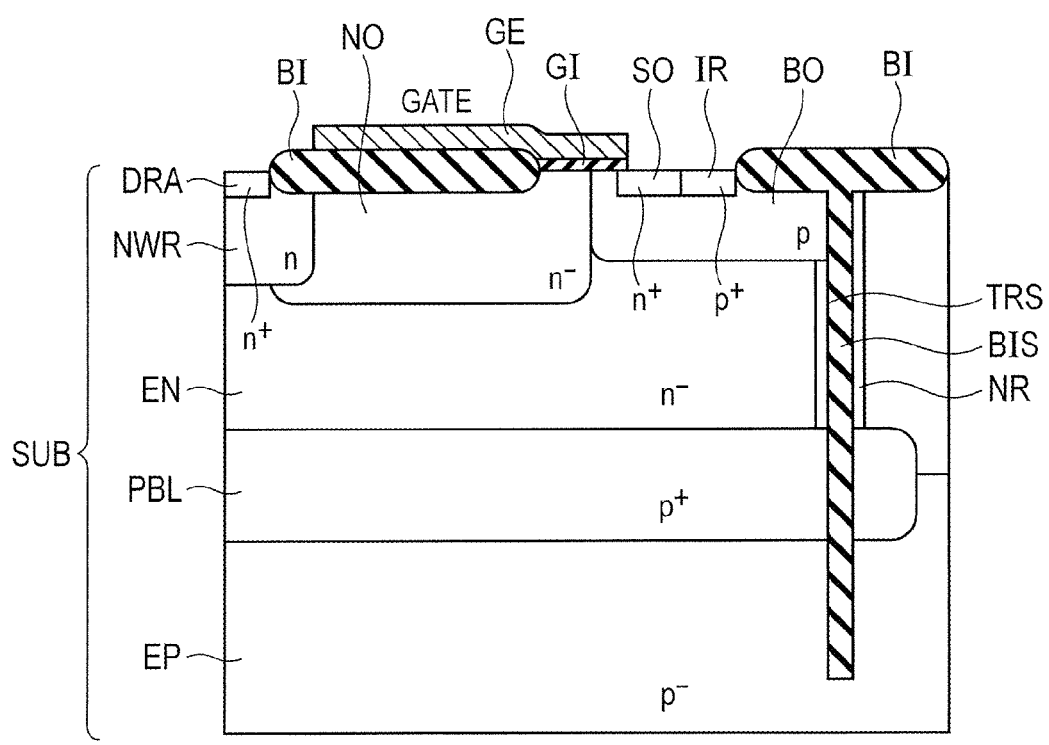
FIG. 18 is a schematic cross-sectional view showing a thirteenth step of the method of manufacturing the semiconductor device of First Embodiment.

As shown in FIG. 18, the main surface of the semiconductor substrate SUB is thermally oxidized and then a polycrystalline silicon film is formed, for example, by using CVD (chemical vapor deposition) so as to cover the thermally oxidized main surface of the semiconductor substrate SUB. Next, n type ions such as phosphorus ions are implanted into the polycrystalline silicon film by using ion implantation. Then, by the usual photolithography and etching, a gate electrode layer GE is formed so that a portion of the polycrystalline silicon film is stranded on a portion of the buried insulating film BI and at the same time, a gate insulating film GI is present as a thermal oxidation film on the $p^+$ type impurity region IR and $n^+$ type source region SO.

Figure 19:
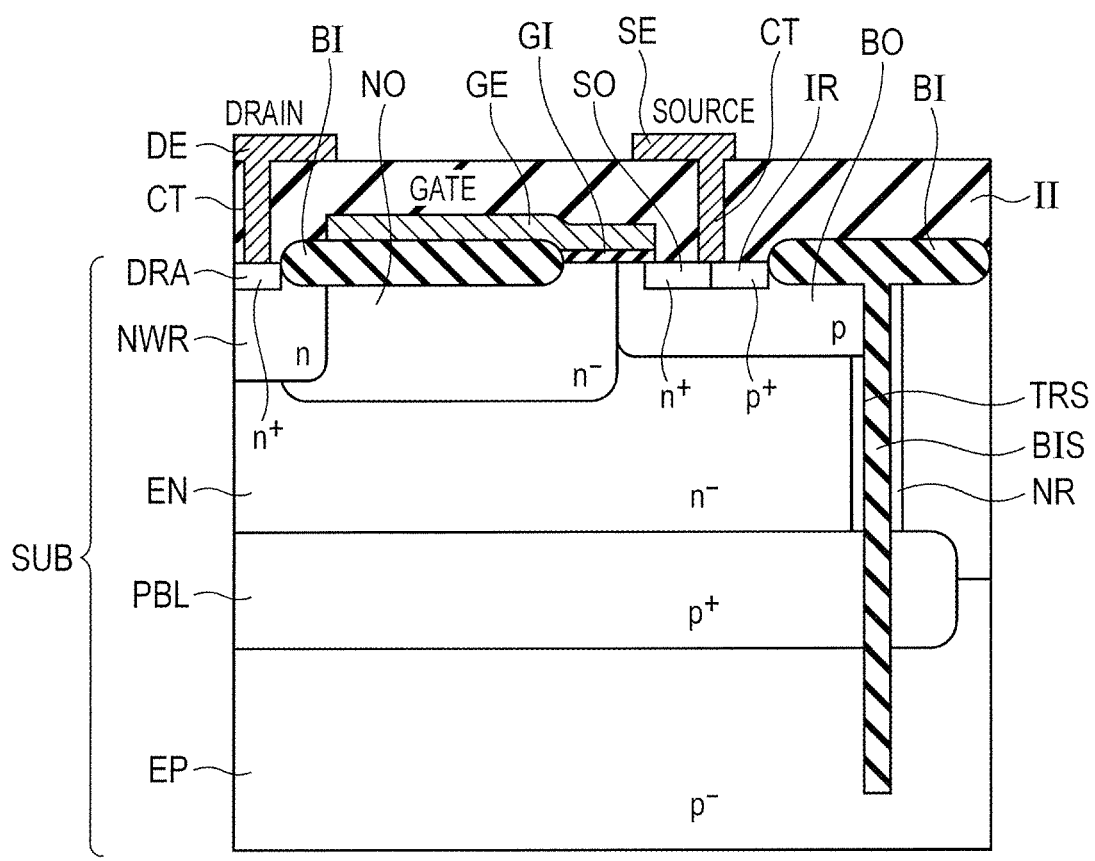
FIG. 19 is a schematic cross-sectional view showing a fourteenth step of the method of manufacturing the semiconductor device of First Embodiment.

As shown in FIG. 19, a silicon oxide film as an interlayer insulating film II is formed, for example, by CVD (chemical vapor deposition) so as to cover the main surface of the semiconductor substrate SUB. Then, the interlayer insulating film II right above the $n^+$ drain region DRA and right above a pn junction between the n type source region SO and the $p^+$ type impurity region IR are removed by the usual photolithography and etching to form contacts CT. The contacts CT are then filled, for example, with tungsten. Further, titanium nitride (TiN) and aluminum copper (AlCu) patterns are formed by sputtering, the usual photolithography, and etching and by using these patterns, a drain electrode DE and a source electrode SE are formed.

As a result, the semiconductor device (LDMOS) as shown in FIG. 1 is formed. It is to be noted that the interlayer insulating film II and the contacts CT shown in FIG. 19 are omitted from FIG. 1.

Figure 20:
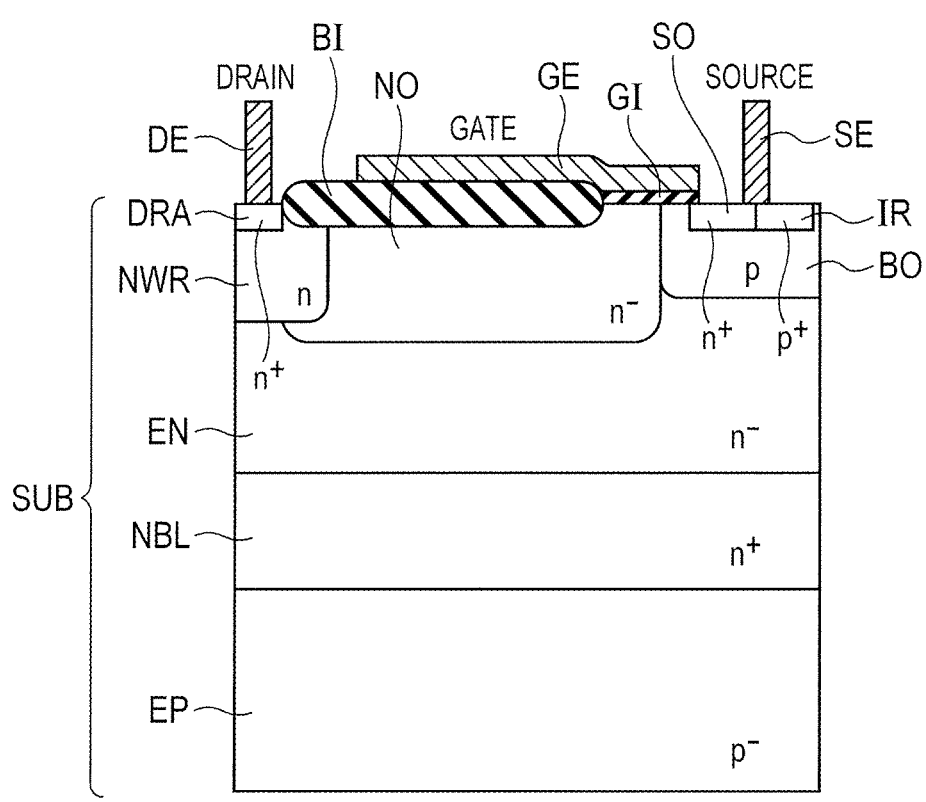
FIG. 20 shows the configuration of a semiconductor device as a comparative example of FIG. 1 while omitting an isolation trench TRS therefrom.

Next, referring to a comparative example, an operation advantage of First Embodiment will next be described. As shown in FIG. 20, a semiconductor device of comparative Example has basically a similar configuration to that of First Embodiment shown in FIG. 1, but a semiconductor substrate SUB between a $p^-$ type epitaxial region EP and an $n^-$ type epitaxial region EN has therein an $n^+$ type buried region NBL having an n type impurity. The n type impurity concentration in the $n^+$ type buried region NBL is higher than the n type impurity concentration in the $n^-$ type epitaxial region EN.

An LDMOS itself is required to have a high breakdown voltage when it is used as a so-called driver circuit for supplying an electric power to a power supply circuit. No pn junction is however formed between the $n^-$ type epitaxial region EN and the $n^+$ type buried region NBL so that the LDMOS of FIG. 20 cannot easily satisfy the request for high breakdown voltage.

An increase in the distance between a source electrode ($n^+$ type source region SO) and a drain electrode ($n^+$ type drain region DRA) can be thought as one measure for satisfying the high breakdown voltage requirement of the LDMOS of FIG. 20. In this case, there is a possibility of the so-called ON resistance of the LDMOS increasing. When the LDMOS of FIG. 20 is used as a so-called low-side driver, it is required to have a reduced ON resistance in order to reduce a power loss. A reduction in ON resistance however, leads to a reduction in breakdown voltage. The ON resistance and the breakdown voltage are in a so-called trade-off relationship.

Figure 21:
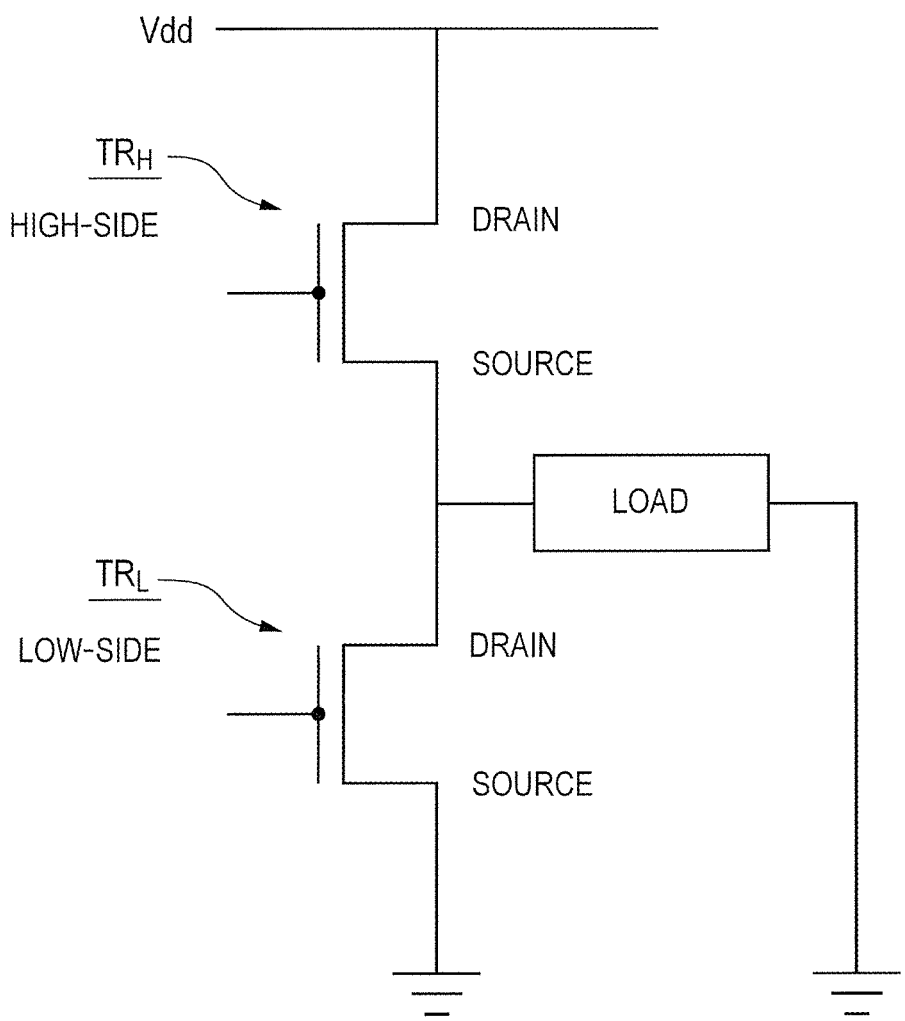
FIG. 21 is a circuit diagram for describing a high-side element and a low-side element.

As is shown in FIG. 21, in this circuit diagram, the source region of a high-side driver $TR_H$ as a high-side element and the drain region of a low-side driver $TR_L$ as a low-side element are coupled to each other and a load is coupled to a joint therebetween. A voltage Vdd (for example, 45V) is applied to the drain region of the high-side driver $TR_H$ and the source region of the low-side driver $TR_L$ and the above-mentioned load are grounded (in other words, a voltage of 0V has been applied).

Figure 22:
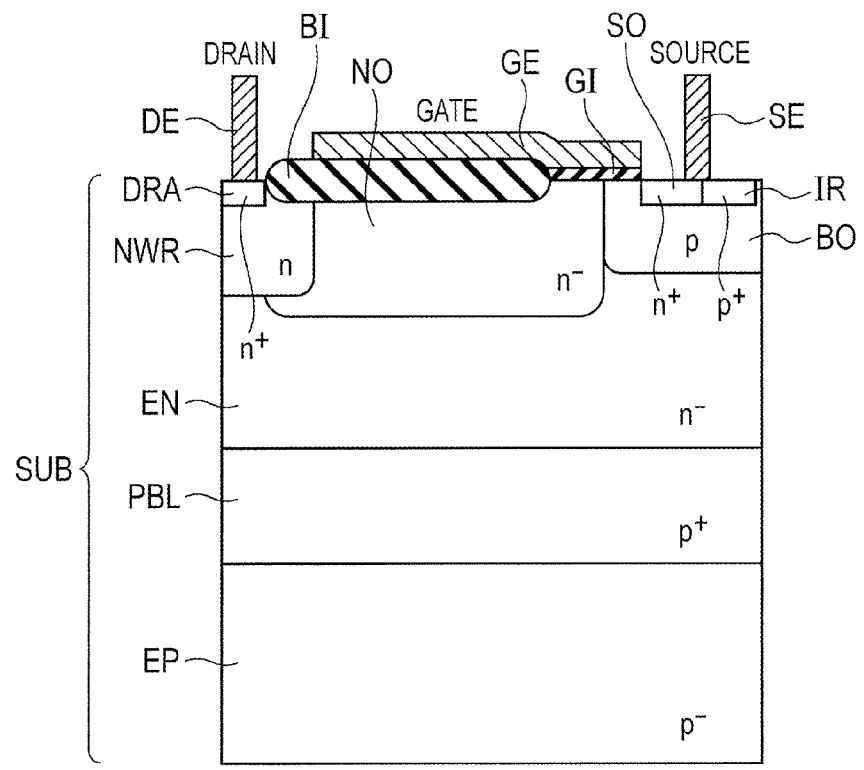
FIG. 22 shows the configuration of the semiconductor device of FIG. 1 according to First Embodiment while omitting the isolation trench TRS as in FIG. 20.

As shown in FIG. 22, a $p^+$ type buried region PBL (having an impurity concentration higher than that of the $p^-$ type epitaxial region EP) is formed instead of the $n^+$ buried region NBL as in First Embodiment (FIG. 1). This makes it possible to extend a depletion layer at a pn junction between the $n^-$ type epitaxial region EN and the $p^+$ type buried region PBL and thereby suppress a drastic increase in electric field at a pn junction between the n type offset region NO and the p type body region BO. An increase in electric field is alleviated, leading to an increase in breakdown voltage. Thus, the breakdown voltage can be increased even if the size of the LDMOS is reduced and both a reduction in ON resistance and an increase in breakdown voltage can be achieved simultaneously.

Figure 23:
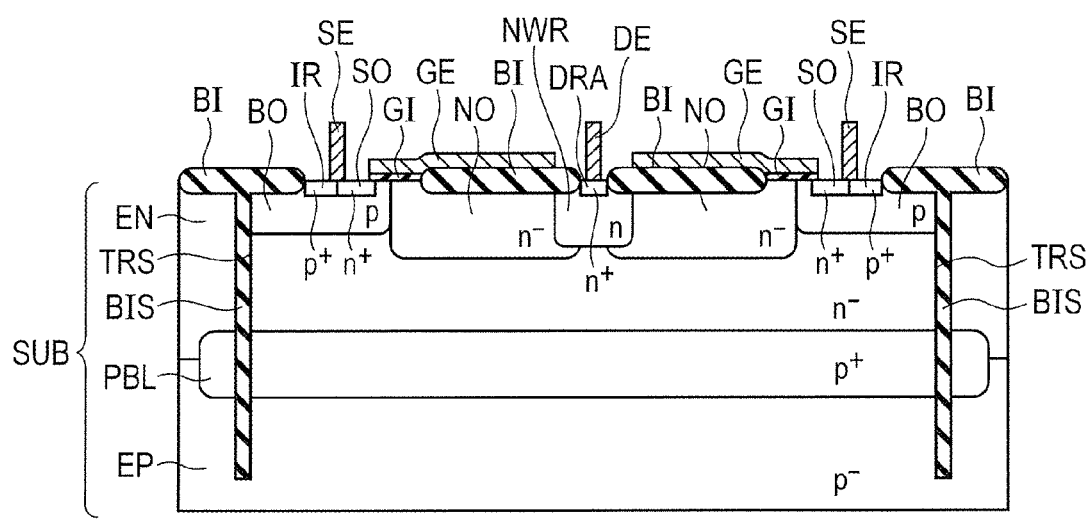
FIG. 23 is a cross-sectional view schematically showing the configuration of arranged unit portions of the semiconductor device in a planar view as a comparative example of FIGS. 2A and 2B.

As shown in FIG. 23, the configuration shown in this drawing is basically similar to that of FIG. 2B and the configuration of FIG. 22 has been applied. It is however different from FIG. 2B in that it has no trench sidewall n type region NR.

In the semiconductor device of FIG. 23, an n⁻ type epitaxial region EN is formed so that the n type impurity concentration of it becomes relatively low, more specifically, about $1 \times 10^{15}$ atom cm⁻³ or higher but not higher than $5 \times 10^{15}$ atom cm⁻³. In particular, when the n⁻ type epitaxial region EN is exposed during the process, there may occur a trouble, that is, invasion of an impurity and the like from the exposed n⁻ type epitaxial region EN. The configuration of FIG. 23 therefore may become a trigger of contamination, which will next be described more specifically.

Figure 24:
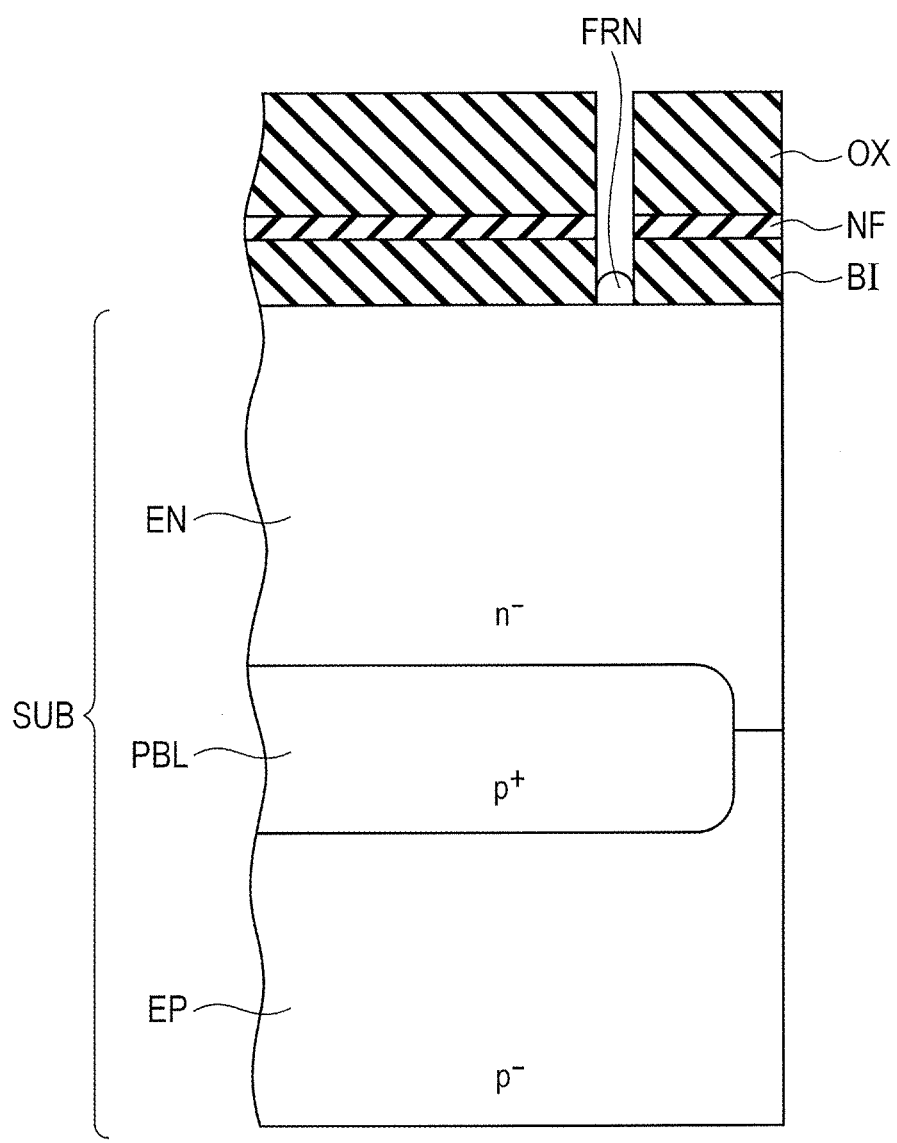
FIG. 24 is a schematic cross-sectional view showing an attachment mode of an impurity to the surface of the semiconductor substrate when the step of FIG. 9 is conducted.

As shown in FIG. 24, for example as in the step of FIG. 9, in forming a mask pattern (composed of a buried insulating film BI, a silicon nitride film NF, and a silicon oxide film OX) for forming an isolation trench TRS, the surface of the n⁻ type epitaxial region EN is exposed in a formation region of a trench (which will be an isolation trench TRS finally) at the end portion of the mask pattern.

Assume that a foreign matter FRN attaches to the exposed surface of the n⁻ type epitaxial region EN. This foreign matter FRN is, for example, a p type impurity such as boron contained in the atmosphere in a clean room.

Figure 25:
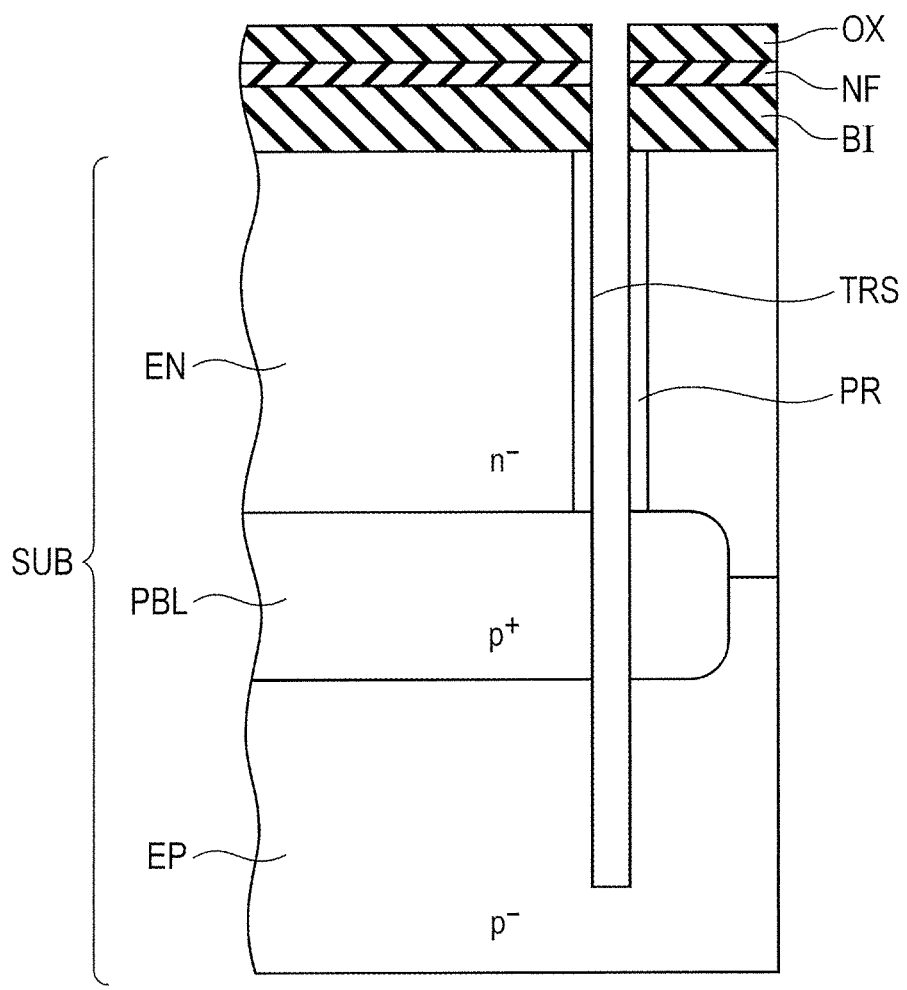
FIG. 25 is a schematic cross-sectional view showing a formation mode of the isolation trench TRS after FIG. 24.

As shown in FIG. 25, if an isolation trench TRS as shown in the step of FIG. 12 is formed without removing the above-mentioned foreign matter FRN, the foreign matter FRN (p type impurity) is driven into the sidewall of the isolation trench TRS and a p type impurity region PR may inevitably be formed on the sidewall and in the vicinity thereof.

Figure 26:
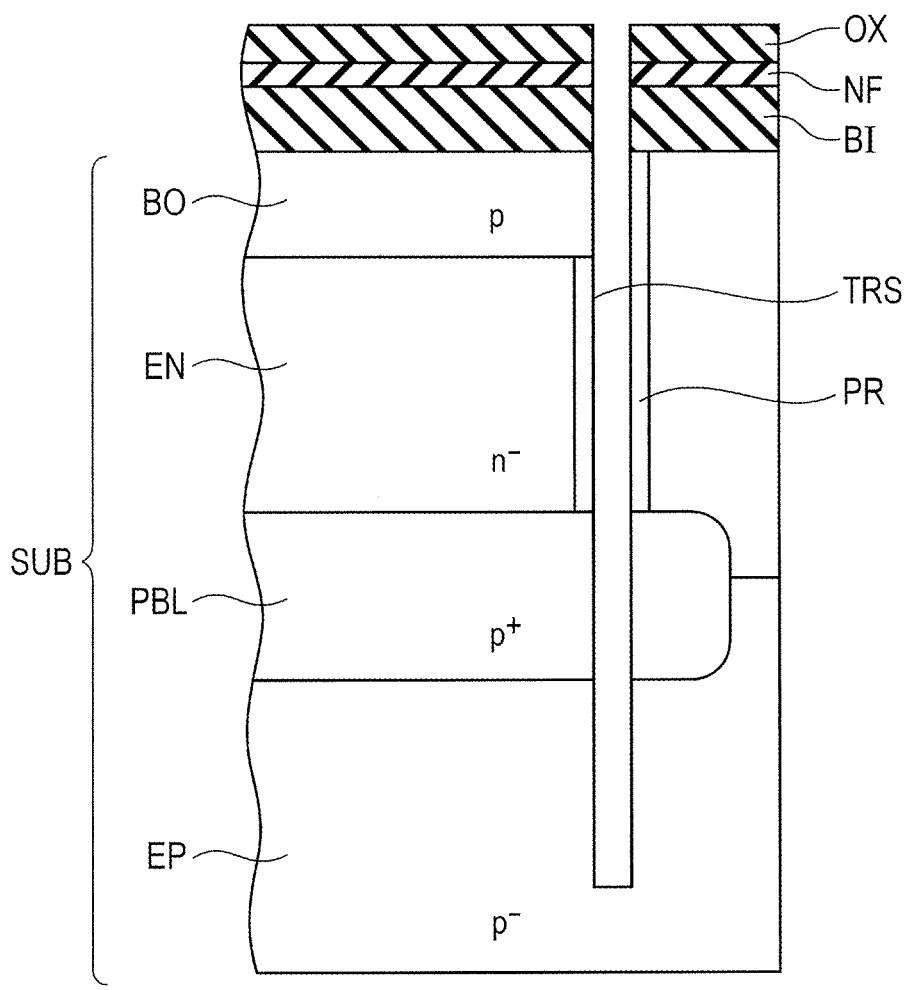
FIG. 26 is a schematic cross-sectional view showing a formation mode of a p type body region BO after FIG. 25.

As shown in FIG. 26, if a subsequent step is conducted under the state of FIG. 25 and a p type body region BO is formed as in the step of FIG. 16, there is a possibility of this p type body region BO, the p type impurity region PR, and the p⁺ type buried region PBL being electrically coupled to one another to cause a short circuit.

By forming, as in First Embodiment, a trench sidewall n type region NR having an n type impurity concentration higher than that of the n⁻ type epitaxial region EN on the sidewall of the isolation trench TRS which is likely to have the p type impurity region PR thereon, it is possible to reduce occurrence of the trouble, that is, formation of the p type impurity region PR at the position of the trench sidewall n type region NR compared with the case where the trench sidewall n type region NR is not formed. As a result, a short circuit between the p type body region BO and the p⁺ type buried region PBL can be suppressed.

Since the isolation trench TRS extends from the main surface to reach the p⁺ type buried region PBL, the trench sidewall n type region NR can be extended along the sidewall to reach the p⁺ type buried region PBL. A short circuit between the p type body region BO and the p⁺ type buried region PBL can therefore be suppressed more stably.

In short, the LDMOS according to First Embodiment can achieve both a reduction in ON resistance and an increase in breakdown voltage simultaneously and at the same time, can suppress a short circuit between the p type body region BO and the p⁺ type buried region PBL.

If the n type impurity concentration of the trench sidewall n type region NR exceeds the p type impurity concentration of the p⁺ type buried region PBL, there is a possibility of disappearance of the p⁺ type buried region PBL because the p type impurity of the p⁺ buried region PBL is counteracted by the n type impurity of the trench sidewall n type region NR. Such a trouble can be suppressed by making the n type impurity concentration of the trench sidewall n type region NR lower than the p type impurity concentration of the p⁺ type buried region PBL.

For example, when the isolation trench TRS reaches the p⁺ type buried region PBL and penetrates through the p⁺ type buried region PBL as shown in FIG. 10, the semiconductor element inside the isolation trench TRS and the semiconductor element outside the isolation trench TRS can be electrically separated more stably. This makes it possible to increase the breakdown voltage of the whole semiconductor device further.

The LDMOS can maximize its RESURF effect when the p⁺ type buried region PBL and the isolation trench TRS are coupled to each other.

Further, as shown in FIG. 13, n type ions (phosphorus) are implanted in an oblique direction with respect to the sidewall so that ion implantation can be conducted while keeping a predetermined concentration irrespective of the depth of the sidewall, making it possible to precisely control the dose.

Second Embodiment

Figure 27:
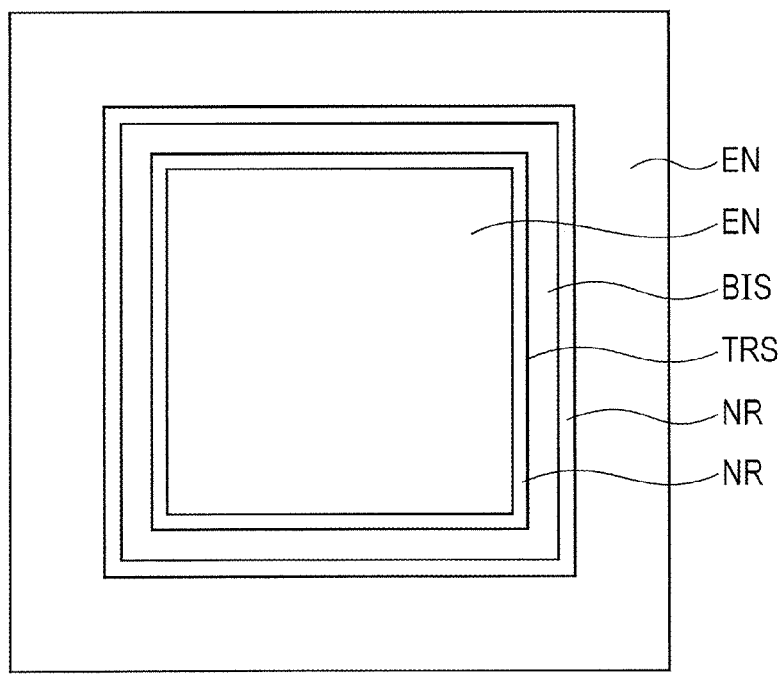
FIG. 27 is a schematic plan view showing a first example of a formation mode of the trench sidewall n type region NR.

As shown in FIG. 27, a semiconductor device such as LDMOS has been formed in a region surrounded with an isolation trench TRS in this plan view. In FIG. 27, a trench sidewall n type region NR has been formed on the sidewall of the isolation trench TRS on which the LDMOS is placed (inside the isolation trench TRS) and on the sidewall of the isolation trench on the side opposite to the LDMOS (outside the isolation trench TRS).

Figure 28:
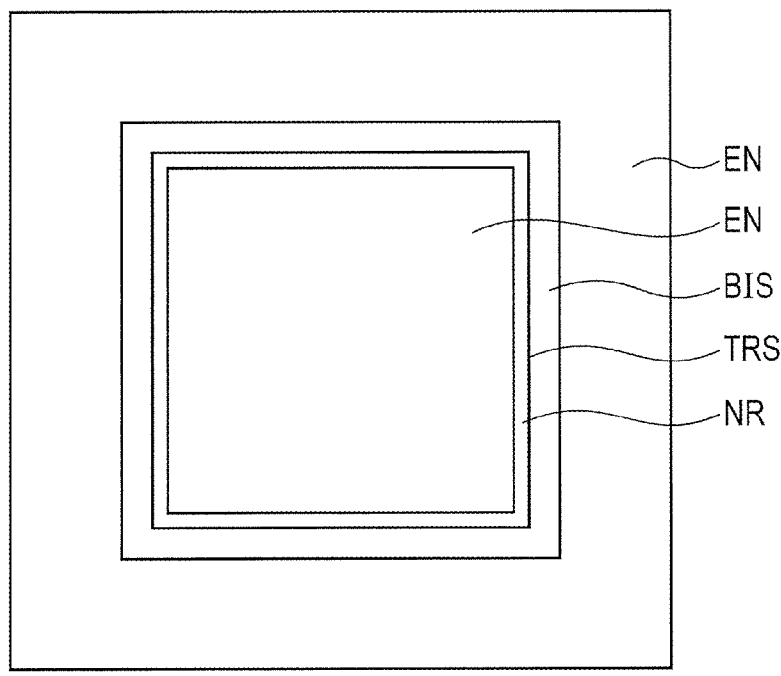
FIG. 28 is a schematic plan view showing a second example of the formation mode of the trench sidewall n type region NR.

On the other hand, as shown in FIG. 28, the trench sidewall n type region NR may be formed on at least only the LDMOS side of the isolation trench TRS and the sidewall on the side opposite to the LDMOS (outside the isolation trench TRS) does not necessarily have the trench sidewall n type region NR.

The trench sidewall n type region NR is formed, as described above, with the purpose of suppressing a trouble such as formation of the p type impurity region PR (refer to FIG. 25) between the p type body region BO and the p⁺ type buried region PBL configuring the LDMOS. The trench sidewall n type region NR may therefore be formed only on the side where the p type body region BO is formed, that is, on the LDMOS side.

When the trench sidewall n type region NR is formed on both the LDMOS side of the isolation trench TRS and the side opposite to the LDMOS as shown in FIG. 27, ion implantation treatment is preferably conducted while turning the semiconductor substrate SUB as described above. In a mode where the trench sidewall n type region NR has been formed on only the LDMOS side of the isolation trench TRS as shown in FIG. 28, on the other hand, the region can be formed by forming a mask pattern not permitting ion implantation into the sidewall on the side opposite to the LDMOS.

The trench sidewall n type region NR having a rectangular planar shape as shown in FIG. 27 and FIG. 28 is formed by conducting ion implantation for each rectangular plane, that is, repeating a similar treatment four times.

Third Embodiment

First, the configuration of a semiconductor device according to the present embodiment will be described referring to FIG. 29.

Figure 29:
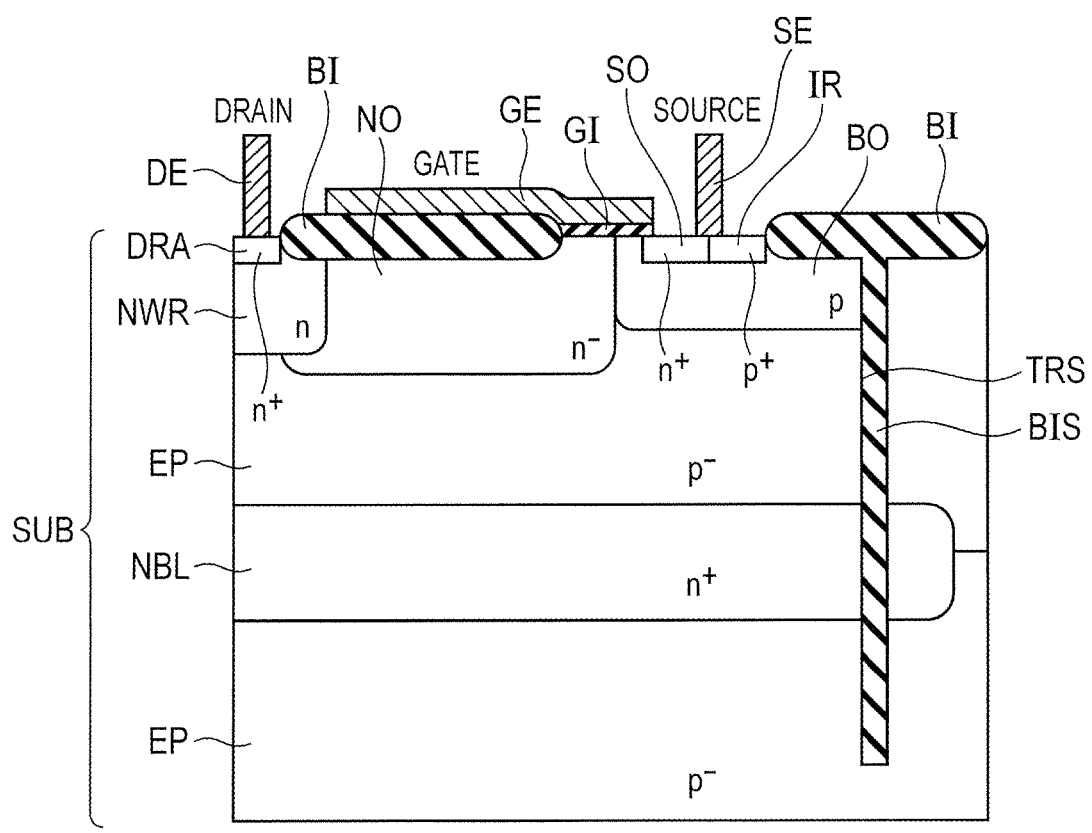
FIG. 29 is a cross-sectional view schematically showing the configuration of a semiconductor device according to Third Embodiment.

As shown in FIG. 29, the semiconductor device according to the present embodiment has basically a similar configuration to that of the semiconductor device of First Embodiment shown in FIG. 1. In FIG. 29, however, the $p^+$ type buried region PBL has been replaced by an $n^+$ type buried region NBL and the $n^-$ type epitaxial region EN has been replaced by a $p^-$ type epitaxial region EP. In addition, an isolation trench TRS has, on the sidewall thereof, no trench sidewall n type region NR. FIG. 29 and FIG. 1 are different from each other in the above-mentioned points, but configurations shown in FIG. 29 and FIG. 1 are the same in the other points.

In the LDMOS shown in FIG. 29, the $n^+$ type buried region NBL and the $p^-$ type epitaxial region EP configure a pn junction. Since a depletion layer extends at this pn junction, a drastic increase in electric field can be suppressed at the pn junction between an n type offset region NO a p type body region BO. The LDMOS can therefore have a high breakdown voltage.

In the LDMOS of FIG. 29, a trouble, that is, a short circuit between the p type body region BO and the $n^+$ type buried region NBL is suppressed by the existence of the $n^+$ type buried region NBL having a relatively high n type impurity concentration. In addition, the p type body region BO and the $n^+$ type buried region NBL originally have therebetween a p type epitaxial region EP. In the LDMOS of FIG. 29, therefore, there is a reduced possibility of contamination with a foreign matter, that is, a p type impurity from the isolation trench TRS.

The LDMOS of FIG. 20 can be used not only as a so-called low-side driver but also as a high-side driver. For example, it is possible to form a semiconductor device having, on one semiconductor substrate SUB, the LDMOS of FIG. 1 having the $p^+$ type buried region PBL and the $n^-$ type epitaxial region EN and used as a low-side driver and the LDMOS of FIG. 20 having the $n^+$ type buried region NBL and the $n^-$ type epitaxial region EN and used as a high-side driver. Leakage characteristics, in the semiconductor device having the low-side driver of FIG. 1 and the high-side driver of FIG. 20, between these drivers will next be described referring to FIG. 30.

Figure 30:
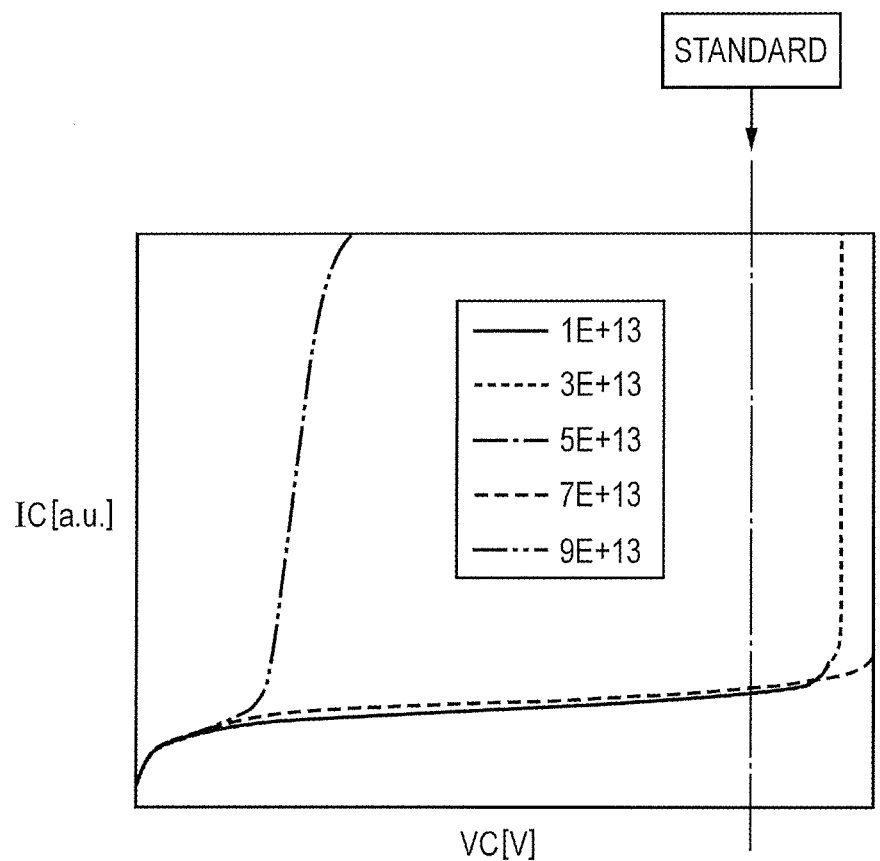
FIG. 30 is a graph showing a current-voltage characteristic of the semiconductor device shown in FIG. 29.

As shown in FIG. 30, a relative value of a voltage VC to be applied between a source and a drain when the LDMOS of FIG. 20 is used as a high-side driver is plotted along the abscissa of this graph, while a relative value of a leakage current IC passing between the high-side driver of FIG. 20 and the low-side driver of FIG. 1 is plotted along the ordinate. In addition, a standard value of VC required for the LDMOS when it is used as a high-side driver, that is, a voltage value necessary for using it without a trouble is shown in this graph. The dose of an n type impurity (phosphorus) in the graph is a dose for the formation of the trench sidewall n type region NR of the LDMOS of FIG. 1 (having a $p^+$ type buried region PBL) as a low-side driver to be incorporated in the semiconductor substrate SUB, together with the LDMOS of FIG. 20 (having an $n^+$ type buried region NBL) as a high-side driver.

It has been revealed from FIG. 30 that when the dose for the formation of the trench sidewall n type region NR of the LDMOS of FIG. 1 to be incorporated, together with the LDMOS of FIG. 20, in the same semiconductor substrate SUB becomes $9\times10^{13}$ atom/cm$^2$, current leakage through the trench sidewall n type region NR between the high-side driver and the low-side driver increases. The leakage current value between the high-side driver and the low-side driver therefore increases even at a voltage less than the standard value of the voltage VC to be applied between the source and drain under the dose of $9\times10^{13}$ atom/cm$^2$ (the maximum impurity concentration of phosphorus at this time is about $4\times10^{16}$ atom cm$^{-3}$, based on FIG. 3B).

It is therefore preferred to adjust the dose to less than $9\times10^{13}$ atom/cm$^2$ from the standpoint of suppressing such current leakage. Thus, the dose of phosphorus for the formation of the trench sidewall n type region NR is preferably adjusted to $3\times10^{13}$ atom/cm$^2$ or greater but not greater than $7\times10^{13}$ atom/cm$^2$.

Figure 31:
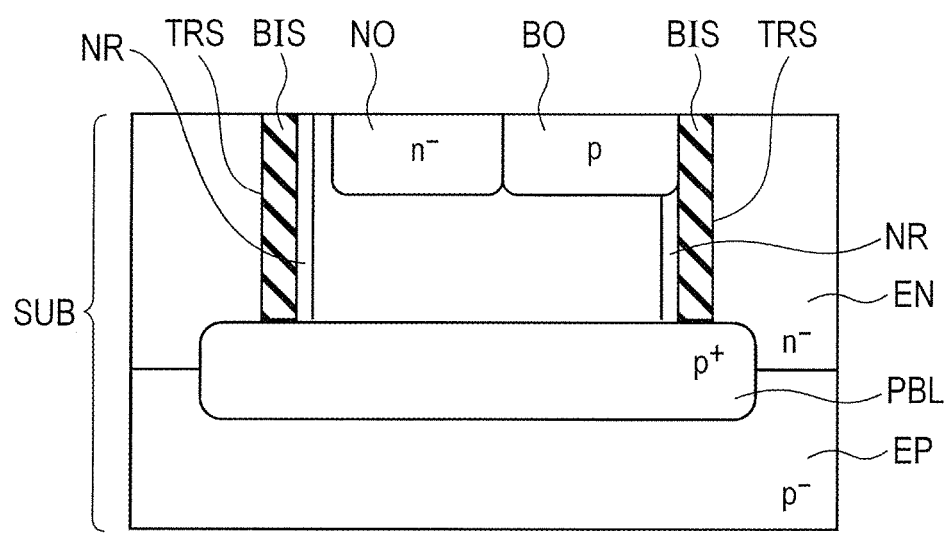
FIG. 31 is a schematic cross-sectional view showing only the main points of the semiconductor device according to First Embodiment.

At the end, the main points of First Embodiment will be extracted and described referring to FIG. 31. As shown in FIG. 31, the semiconductor device according to First Embodiment such as LDMOS has a $p^-$ type epitaxial region EP formed in a semiconductor substrate SUB having a main surface and an $n^-$ type epitaxial region EN formed in the semiconductor substrate SUB and on the $p^-$ type epitaxial region EP on the main surface side of the semiconductor substrate SUB. In addition, the semiconductor device has an n type offset region NO formed in the semiconductor substrate SUB and on the $n^-$ type epitaxial region EN on the main surface side of the semiconductor substrate SUB and a p type body region BO formed in the semiconductor substrate SUB so as to be adjacent to the n type offset region NO to configure a pn junction therewith on the $n^-$ type epitaxial region EN on the main surface side of the semiconductor substrate SUB. The semiconductor device has a $p^+$ type buried region PBL formed in the semiconductor substrate SUB between the $p^-$ type epitaxial region EP and the $n^-$ type epitaxial region EN and having a p type impurity concentration higher than that of the $p^-$ type epitaxial region EP and an isolation trench TRS extending so as to surround the periphery of the LDMOS including the n type offset region NO and to reach the $p^+$ type buried region PBL from the main surface of the semiconductor substrate SUB. The semiconductor device has a trench sidewall n type region NR formed on at least a portion of the side wall of the isolation trench TRS on the LDMOS formation side (for example, the lower side of FIG. 31). The n type impurity concentration in the trench sidewall n type region NR is higher than the n type impurity concentration in the $n^-$ type epitaxial region EN. The trench sidewall n type region NR extends along the sidewall of the isolation trench TRS to reach the $p^+$ type buried region PBL.

The invention made by present inventors has been described specifically based on some embodiments. The present invention is not limited to or by these embodiments and needless to say, it can be modified in various ways without departing from the gist of the invention.

What is claimed is:

1. A semiconductor device, comprising:
   a semiconductor substrate having a main surface;
   a first conductivity type first region formed in the semiconductor substrate;
   a second conductivity type second region formed in the semiconductor substrate and over the first region on the main surface side;
   a second conductivity type third region formed in the semiconductor substrate and over the second region on the main surface side;
   a first conductivity type fourth region formed in the semiconductor substrate so as to be adjacent to the third region and configure a pn junction therewith over the second region on the main surface side;
   a first conductivity type buried region formed in the semiconductor substrate between the first region and the second region and having a first conductivity type impurity concentration higher than that of the first region;

an isolation trench extending so as to surround the periphery of an element region including the third region and reaching the buried region from the main surface; and a second conductivity type trench sidewall high concentration region formed over at least a portion of the sidewall of the isolation trench on the side of the element region, wherein a second conductivity type impurity concentration in the trench sidewall high concentration region is higher than the second conductivity type impurity concentration in the second region, and wherein the trench sidewall high concentration region extends along the sidewall to reach the buried region.

2. The semiconductor device according to claim 1, wherein the first conductivity type is a p type and the second conductivity type is an n type.

3. The semiconductor device according to claim 1, wherein the second conductivity type impurity concentration in the trench sidewall high concentration region is lower than the first conductivity type impurity concentration in the buried region.

4. The semiconductor device according to claim 1, wherein the isolation trench extends from the main surface to penetrate through at least the buried region.

5. A method of manufacturing a semiconductor device, comprising:

providing a semiconductor substrate having a main surface and a first conductivity type first region;

forming, in the semiconductor substrate and over the first region on the main surface side, a first conductivity type buried region having a first conductivity type impurity concentration higher than that of the first region;

forming, in the semiconductor substrate and over the first region and the buried region on the main surface side, a second conductivity type second region;

forming, in the semiconductor substrate and over the second region on the main surface side, a second conductivity type third region;

forming an isolation trench extending so as to surround the periphery of an element region including the third region and reach the buried region from the main surface;

forming a second conductivity type trench sidewall high concentration region over at least a portion of the sidewall of the isolation trench on the side of the element region; and forming a first conductivity type fourth region in the semiconductor substrate so as to be adjacent to the third region and configure a pn junction therewith over the second region on the main surface side, wherein the second conductivity type impurity concentration in the trench sidewall high concentration region is higher than the second conductivity type impurity concentration in the second region, and wherein the trench sidewall high concentration region extends along the sidewall to reach the buried region.

6. The method of manufacturing a semiconductor device according to claim 5, wherein in the forming a trench sidewall high concentration region, a second conductivity type impurity is ion-implanted from an oblique direction with respect to the sidewall.

* * * * *